(12) United States Patent
Kawasaki

(10) Patent No.: US 8,786,304 B2
(45) Date of Patent: Jul. 22, 2014

(54) SEMICONDUCTOR DEVICE INCLUDING SWITCH FOR COUPLING POWER LINE

(75) Inventor: Kenichi Kawasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 318 days.

(21) Appl. No.: 13/184,214

(22) Filed: Jul. 15, 2011

(65) Prior Publication Data

US 2011/0267097 A1    Nov. 3, 2011

Related U.S. Application Data

(62) Division of application No. 12/191,813, filed on Aug. 14, 2008, now Pat. No. 8,004,302.

(30) Foreign Application Priority Data

Aug. 20, 2007    (JP) .................................. 2007-214072

(51) Int. Cl.
    *G01R 31/26*    (2014.01)
(52) U.S. Cl.
    USPC .................................. 324/762.01; 324/750.3
(58) Field of Classification Search
    None
    See application file for complete search history.

(56) References Cited

U.S. PATENT DOCUMENTS

| | | | |
|---|---|---|---|
| 6,894,520 B2 | 5/2005 | Yamashita et al. | |
| 6,900,628 B2 | 5/2005 | Shirahama et al. | |
| 8,004,302 B2 * | 8/2011 | Kawasaki | 324/762.01 |
| 8,013,625 B2 * | 9/2011 | Kawasaki | 324/762.01 |
| 8,085,614 B2 * | 12/2011 | Lee | 365/229 |
| 2008/0296977 A1 | 12/2008 | Kawasaki | |

FOREIGN PATENT DOCUMENTS

| | | |
|---|---|---|
| JP | 10-21699 A | 1/1998 |
| JP | 2003-98223 A | 4/2003 |
| JP | 2004-37202 A | 2/2004 |

OTHER PUBLICATIONS

Japanese Office Action dated Feb. 7, 2012 issued in corresponding Japanese Application No. 2007-214072 with a Partial English-language Translation.

* cited by examiner

*Primary Examiner* — Vinh Nguyen
(74) *Attorney, Agent, or Firm* — Arent Fox LLP

(57) ABSTRACT

A semiconductor device whose operational state is switched between a test state and a normal operational state according to a logical value of a signal input from the outside is provided. The semiconductor device includes a first power line, a second power line, a switch that is controlled by a signal line to couple/isolate the first power line to/from the second power line, a control circuit that outputs a control signal, and a state switching circuit that drives the signal line to couple/isolate the first power line to/from the second power line according to a logical value of the control signal when the input signal is one of logical values, whereas the state switching circuit drives the signal line to couple the first power line to the second power line when the first signal is the other logical value.

1 Claim, 10 Drawing Sheets

FIG.3

| A | B | C | STATE | PGT |
|---|---|---|---|---|
| 0 | 0 | 0 | The internal circuit 36,39,40 operate in accordance with 400MHz clock. | 1 |
| 0 | 0 | 1 | The internal circuit 36,39,40 operate in accordance with 200MHz clock. | 1 |
| 0 | 1 | 0 | The internal circuit 36,39,40 operate in accordance with 100MHz clock. | 1 |
| 0 | 1 | 1 | The internal circuit 36,39,40 operate in accordance with external clock. | 1 |
| 1 | 0 | 0 | The internal circuit 36,39 operate in accordance with 400MHz clock. The internal circuit 40 operate in accordance with 100MHz clock. | 1 |
| 1 | 0 | 1 | Reserved | 1 |
| 1 | 1 | 0 | Reserved | 1 |
| 1 | 1 | 1 | For the accelerated test (User cannot use this mode.) | 0 |

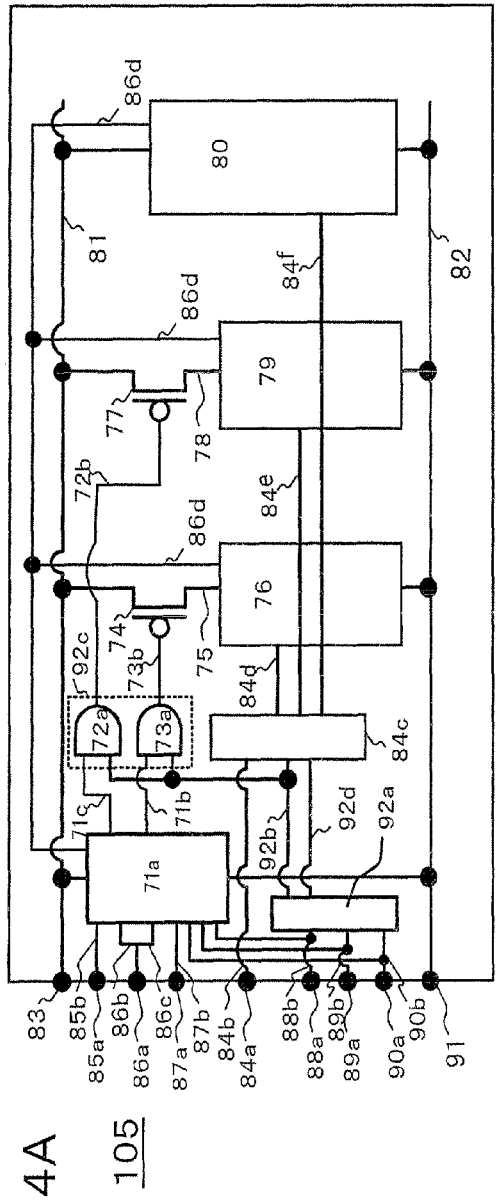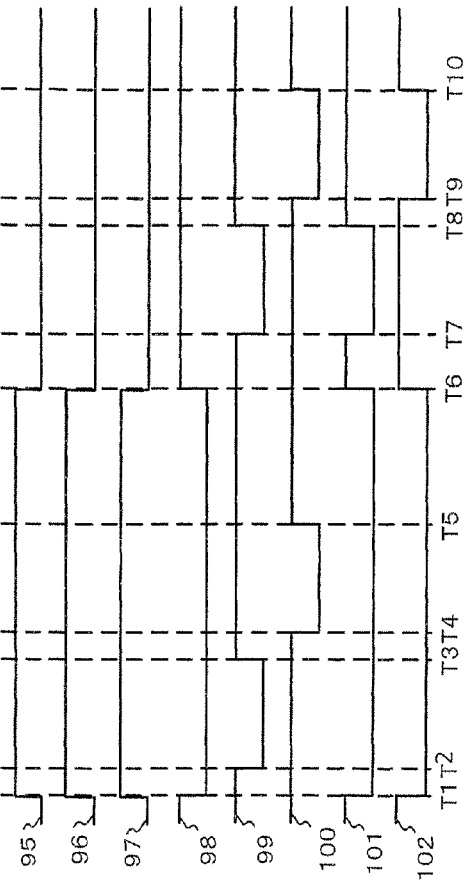
FIG.4A
FIG.4B

FIG.5

| A | B | C | STATE | PGT |
|---|---|---|---|---|
| 0 | 0 | 0 | The internal circuit 76,79,80 operate in accordance with 400MHz clock. | 1 |
| 0 | 0 | 1 | The internal circuit 76,79,80 operate in accordance with 200MHz clock. | 1 |
| 0 | 1 | 0 | The internal circuit 76,79,80 operate in accordance with 100MHz clock. | 1 |
| 0 | 1 | 1 | The internal circuit 76,79,80 operate in accordance with external clock. | 1 |
| 1 | 0 | 0 | The internal circuit 76,79 operate in accordance with 400MHz clock. The internal circuit 80 operate in accordance with 100MHz clock. | 1 |
| 1 | 0 | 1 | Reserved | 1 |
| 1 | 1 | 0 | Reserved | 1 |
| 1 | 1 | 1 | For the accelerated test (User cannot use this mode.) The clock signal 84b can be directly used as the clock signal 84d,84e,84f | 0 |

270

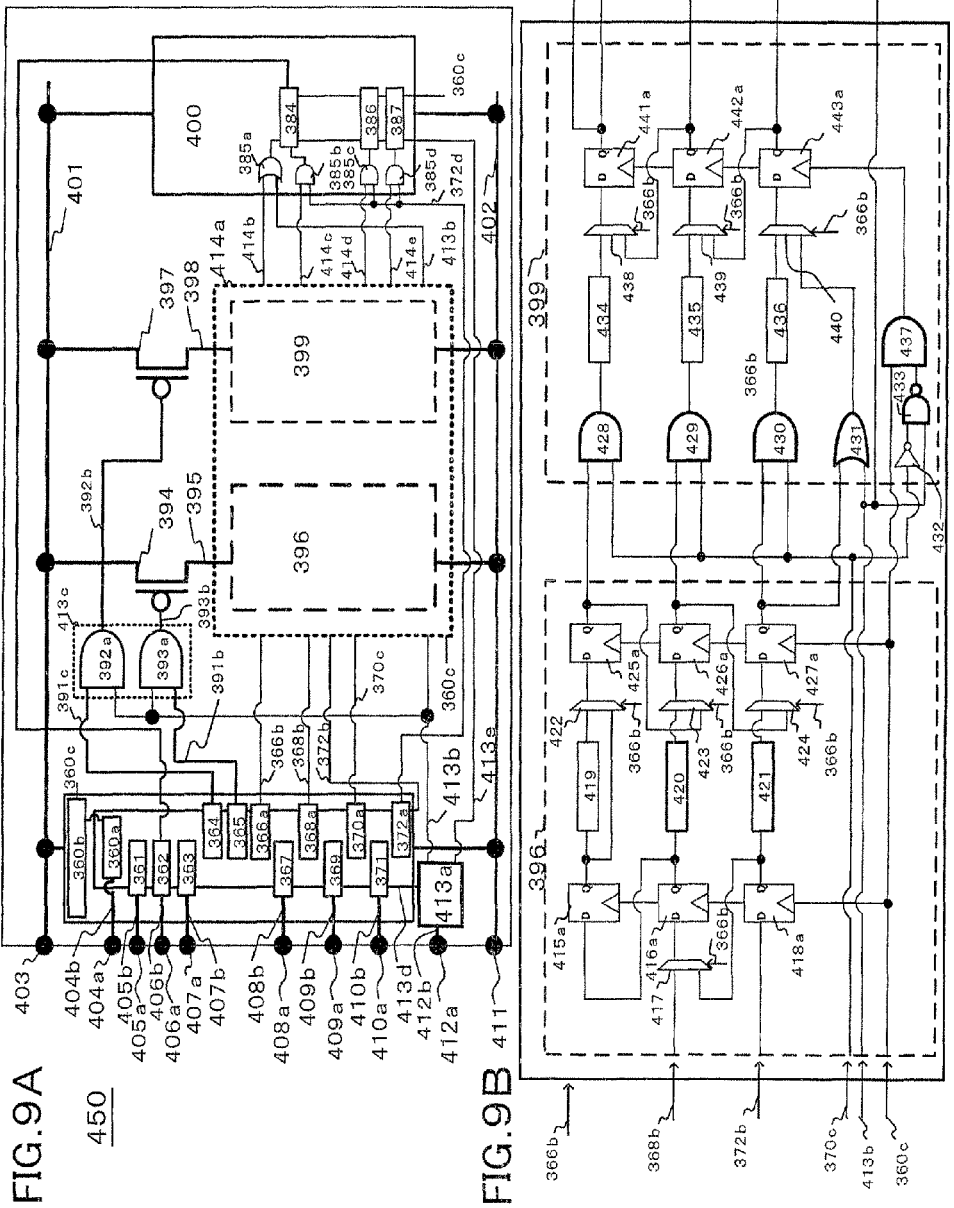

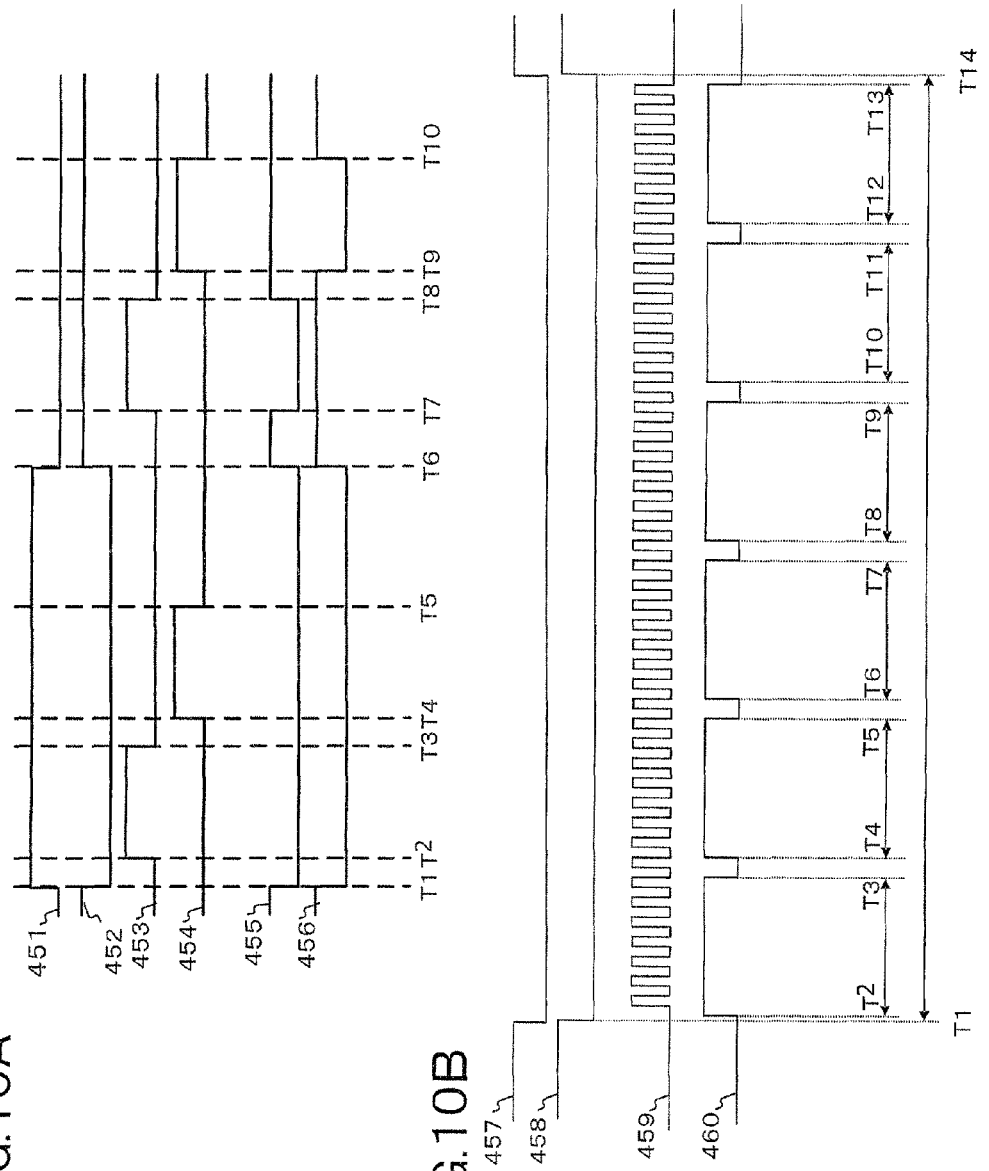

SEMICONDUCTOR DEVICE INCLUDING SWITCH FOR COUPLING POWER LINE

CROSS REFERENCE TO RELATED APPLICATIONS

This Application is a Divisional of U.S. application. Ser. No. 12/191,813 filed on Aug. 14, 2008, now U.S. Pat. No. 8,004,302, which claims the benefit of priority from the prior Japanese Patent Application No. 2007-214072, filed, on Aug. 20, 2007, the entire contents of which are incorporated herein by reference.

BACKGROUND

1. Field

This is related to a semiconductor device having a function, for limiting (cutting) the power supply of an internal circuit.

2. Description of the Related Art

Inclusion of a function of partially limiting (cutting) the power supply of an internal circuit, namely, a so-called power gating function, in large-scale integrated circuits (LSIs) to decrease the power consumption is becoming the mainstream. On the other hand, LSIs have a plurality of test circuits for use in a test of the LSIs. More specifically, the LSIs have circuits, such as an input/output test circuit that performs fault diagnosis of data writing/reading circuits and an accelerated test circuit that performs an accelerated test on internal circuits of the LSIs.

An input/output test circuit includes a circuit that serially couples, in series like a chain, flip flops related to writing and reading of an LSI and a control circuit that receives control signals and test data from outside of the LSI and controls the state of the test (see, for example, Japanese Laid-open Patent Publication No. 2003-98223). In addition, an accelerated test circuit includes a circuit that applies an accelerated test voltage to an internal circuit and a control circuit that receives control signals from outside of an LSI and controls the state of the test (see, for example, Japanese Laid-open Patent Publication No. 10-21699).

A test of an LSI having a control circuit that performs a power gating operation and a control circuit that controls the state of the test has to be carried out while allowing the control circuits to operate in cooperation with each other. However, sending a control signal for permitting the cooperation between the control circuits to an LSI from a testing equipment residing outside of the LSI requires an expensive testing equipment having an advanced function, which thus increases the cost for the test.

Nevertheless, when the expensive testing equipment that generates a control signal for permitting the cooperation between control circuits does not employed and the control circuit that performs the power gating operation and the control circuit that controls the state of the test do not operate in cooperation with each other, the following disadvantages may occur. At the time of an accelerated test, application of a sufficient level of stress, which is carried out by applying a predetermined voltage level to an internal circuit, is not achieved because the power gating function is not cancelled. Additionally, at the time of an input/output test, test data is not transferred since an unexpected power gating operation is activated. As a result, the accelerated test or the input/output test may be undesirably prevented.

SUMMARY

According to one aspect of embodiments, a semiconductor device described bellow is provided. A semiconductor device including a first power line, a second power line, a signal line, a switch for selecting coupling of the first power line to the second power line or isolation of the first power line from the second power line according to a driving state of the signal line, a switching circuit for switching the driving state of the signal line, and a first control circuit for outputting a second signal to the switching circuit, wherein the switching circuit drives the signal line to couple the first power line to the second power line or to isolate the first power line from the second power line according to a logical value of the second signal when a first signal making an operational state of the semiconductor device switch between a test state and a normal operational state is set to a first logical value, whereas the switching circuit drives the signal line to couple the first power line to the second power line when the first signal is set to a second logical value.

BRIEF DESCRIPTION OF THE DRAWINGS

FIG. 1A is a circuit diagram of a semiconductor device 30 according to an embodiment 1, whereas

FIG. 2A is a circuit diagram of a semiconductor device 65 according to an embodiment 2, whereas FIG. 2B is a waveform chart of a mode switching circuit 52c and a mode decoder circuit 52a;

FIG. 3 is a table showing combinations of logical values of control signals 48b, 49b, and 50b and operations of a semiconductor device 65 for the respective combinations;

FIG. 4A is a circuit diagram of a semiconductor device 105 according to an embodiment 3, whereas FIG. 4B is a waveform chart of a mode switching circuit 92c and a mode decoder circuit 92a;

FIG. 5 is a table showing combinations of logical values of control signals 88b, 89b, and 90b and operations of a semiconductor device 105 for the respective combinations;

FIG. 7A is a circuit diagram of a semiconductor device 190 according to an embodiment 4, whereas FIG. 7B is a waveform chart of a mode switching circuit 173c and a test control circuit 173a;

FIG. 8A is a circuit diagram of a semiconductor device 270 according to an embodiment 5, whereas FIG. 8B is a waveform chart of a mode switching circuit 253c and a test control circuit 253a;

FIGS. 9A and 9B are circuit diagrams of a semiconductor device 450 according to an embodiment 6; and FIG. 10A shows waveforms of signals in a mode switching circuit 413c, whereas FIG. 10B shows waveforms of an output signal of an AND circuit 437, a test signal 413b, a scan selection signal 366b, a mask signal 370c, and a mask signal 372d.

DESCRIPTION OF THE EMBODIMENTS

Embodiments 1, 2, 3, 4, 5, and 6 will be described below. However, the present invention is not limited to the embodiments.

[Embodiment 1]

An embodiment 1 relates to a semiconductor device that includes a mode switching circuit for performing a logical operation of a test signal and a signal fed from a control circuit for realizing a power gating function (limiting/cutting/isolation of the power supply) and that turns a transistor for coupling/isolating of an external power supply to/from an internal power supply of an internal circuit ON and OFF according to a signal fed from the mode switching circuit. Upon receiving a test signal, the semiconductor device couples the internal circuit to the external power supply regardless of the logical value of the signal fed from the power-gating-realizing control circuit and sets an accelerated test voltage level to a predetermined value using the external power supply.

Figure 1A:
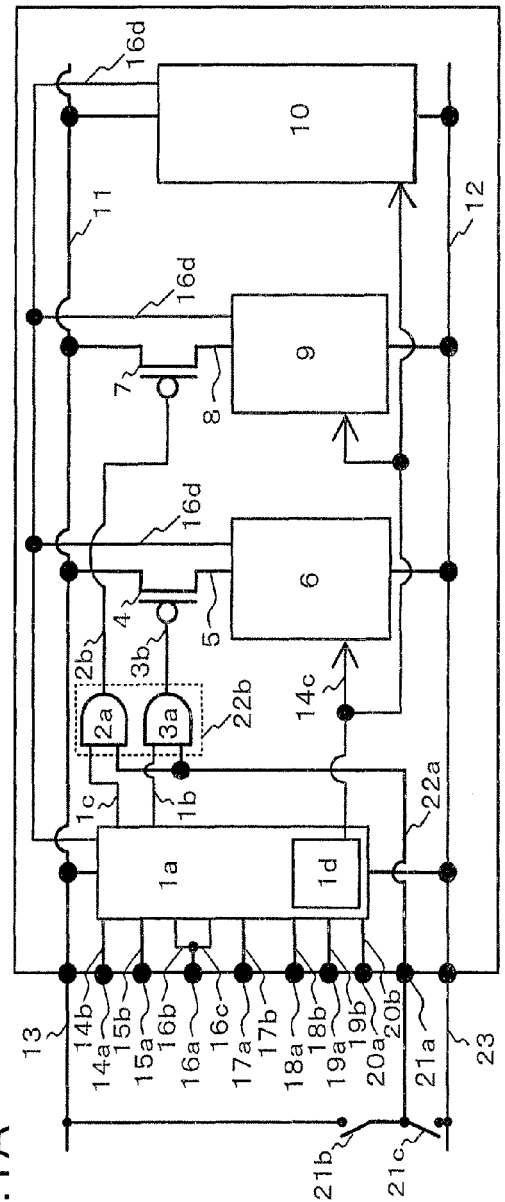
Figure 1B:
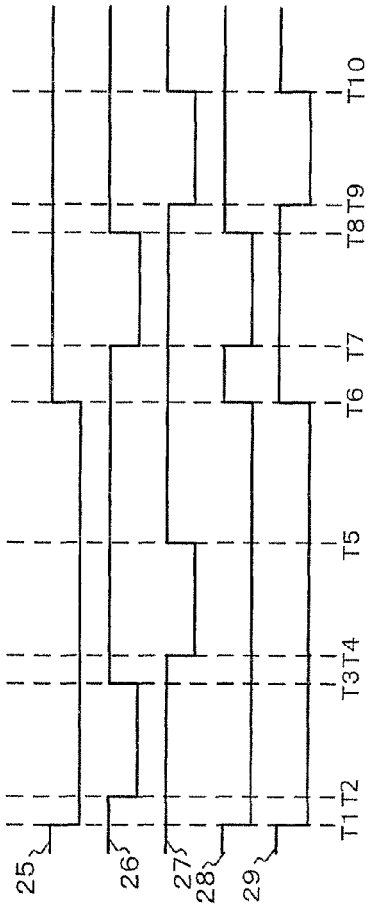
FIG. 1B is a waveform chart of a mode switching circuit 22b.

FIG. 1A is a circuit diagram of a semiconductor device 30 according to an embodiment 1, whereas FIG. 1B is a waveform chart of a mode switching circuit 22b. Referring to FIG. 1A, the semiconductor device 30 includes a power managing unit (PMU) 1a, the mode switching circuit 22b, internal circuits 6, 9, and 10, transistors 4 and 7, and power lines 11 and 12.

According to a clock signal 14b input from a clock terminal 14a, a reset signal 15b input from a reset terminal 15a, an address signal 17b input from an address terminal 17a, and control signals 18b, 19b, and 20b input from control signal terminals 18a, 19a, and 20a, respectively, the PMU 1a receives input data 16b to be supplied to the internal circuits 6, 9, and 10 and outputs output data 16c supplied from the internal circuits 6, 9, and 10. The input data 16b and the output data 16c are input and output from and to a data terminal 16a, respectively. Data is input and output between the PMU 1a and the internal circuits 6, 9, and 10 through an input/output data line 16d.

According to an operational state specified by the reset signal 15b, the address signal 17b, and the control signals 18b, 19b, and 20b, the PMU 1a also performs a power gating operation of the internal circuits 6, 9, and 10. Accordingly, to reduce the power consumption, the PMU 1a has a function of limiting (cutting) the power supply of the internal circuits 6 and 9 that do not have to operate.

To realize the power gating function (power supply limiting/cutting/isolating function), the PMU 1a outputs a control signal g1 (1b) and a control signal g2 (1c).

Additionally, the PMU 1a includes a clock generating circuit 1d. The clock generating circuit 1d amplifies the clock signal 14b and distributes the amplified signal to the internal circuits 6, 9, and 10 as a clock signal 14c.

The mode switching circuit 22b performs a logical operation of the control signal g1 (1b), the control signal g2 (1c), and a test signal 22a fed from an external test terminal 21a and outputs an A1 signal 2b and an A2 signal 3b for controlling ON/OFF of the p-channel metal oxide semiconductor (PMOS) transistors 4 and 7. Details regarding functions and operations of the mode switching circuit 22b will be described with reference to FIG. 1B.

The mode switching circuit 22b includes an AND circuits 2a and 3a. The AND circuit 2a receives the test signal 22a with one input terminal and the control signal g1 (1b) with the other input terminal. The AND circuit 2a determines a logical multiplication (AND) and outputs the result as the A1 signal 2b. The AND circuit 3a receives the test signal 22a with one input terminal and the control signal g2 (1c) with the other input terminal. The AND circuit 3a determines a local multiplication (AND) and outputs the result as the A2 signal 3b.

At the time of a test of the semiconductor device 30, the external test terminal 21a is coupled to an external low-potential power supply (ground-level power supply) through a switch 21c, which causes the test signal 22a to indicate a low logical value "L". At the time of a normal operation, the external test terminal 21a is coupled to an external high-potential power supply through a switch 21b, which causes the test signal 22a to indicate a high logical value "H".

A gate of the PMOS transistor 4 is supplied with the A2 signal 3b, while a source and a drain thereof are coupled to the power line 11 and an internal power line VDDM1 (5) of the internal circuit 6, respectively. According the logical value of the A2 signal 3b, the PMOS transistor 4 is turned ON and OFF, and serves as a switching circuit that couples/isolates the internal circuit 6 to/from the power line 11, respectively.

A gate of the PMOS transistor 7 is supplied with the A1 signal 2b, while a source and a drain thereof are coupled to the power line 11 and an internal power line VDDM2 (8) of the internal circuit 9, respectively. According to the logical value of the A1 signal 2b, the PMOS transistor 7 is turned ON and OFF, and serves as a switching circuit that couples/isolates the internal circuit 9 to/from the power line 11, respectively.

The internal circuit 10 is operated by the power supplied from the power lines 11 and 12. Since the internal circuit 10 is coupled to the power line 11 all the time, the internal circuit 10 operates all the time. In addition, the internal circuits 6 and 9 are coupled to the power line 12 and to the power line 11 according to the logical values of the A2 signal 3b and the A1 signal 2b, respectively. The internal circuits 6 and 9 operate when being coupled to the power line 11 through the PMOS transistors 4 and 7, respectively.

The power line 12 is coupled to an external terminal 23 and supplies a low-potential power (ground-level power). The power line 11 is coupled to an external terminal 13 and supplies a high-potential power.

Functions and operations of the mode switching circuit 22b will be described with reference to a waveform chart shown in FIG. 1B. As shown by a waveform 25, the test signal 22a indicates the logical value "L" during a period between a time T1 and a time T6, i.e., during a test period of the semiconductor device 30.

As shown by a waveform 26, the control signal g1 (1b) having the logical value "H" is input to the mode switching circuit 22b during a period between the time T1 and a time T2 and a period between a time T3 and the time T6 of the test period during which the test signal 22a having the logical value "L" is input to the mode switching circuit 22b. Similarly, as shown by a waveform 27, the control signal g2 (1c) having the logical value "H" is input to the mode switching circuit 22b during a period between the time T1 and a time T4 and a period between a time T5 and the time T6. However, as shown by waveforms 28 and 29, the logical values of the A1 signal 2b and the A2 signal 3b are fixed to "L" regardless of the logical values of the control signal g1 (1b) and the control signal g2 (1c), respectively. As a result, the PMOS transistors 4 and 7 are turned ON during the test period.

On the other hand, as shown by the waveform 25, the test signal 22a indicates the logical value "H" during a period between the time T6 and a time T10, i.e., during a normal operation period of the semiconductor device 30.

As shown by the waveforms 26, 27, 28, and 29, if the control signal g1 (1b) having the logical value "L" and the control signal g2 (1c) having the logical value "L" are input to the mode switching circuit 22b during a period between a time T7 and a time T8 and a period between a time T9 and the time T10 while the mode switching circuit 22b is supplied with the test signal 22a having the logical value "H", the A1 signal 2b having the logical value "L" and the A2 signal 3b having the logical value "L" are output, respectively, according to the logical values of the control signals.

Accordingly, during the normal operation period, the PMOS transistors 7 and 4 are turned ON while the A1 signal 2b and the A2 signal 3b indicate the logical value "L", respectively.

As described above, since the PMOS transistors 4 and 7 are turned ON regardless of the logical values of the signals fed from the power-gating-performing control circuit during the test period, the internal circuits 6 and 9 are coupled to the high-potential power supply through the power line 11 and the external terminal 13. By setting the voltage level of the high-potential power supply to be supplied to the external terminal 13 higher than that to be supplied during the normal operation period in this manner, the accelerated test is performed on the semiconductor device 30.

It is known that a mean time between failures (MTBF) of a semiconductor device, i.e., a life of the semiconductor device, decreases in proportional to the temperature and the voltage. Accordingly, in the accelerated test, a temperature and a voltage higher than ordinal levels are applied to semiconductor devices to accelerate the speed of aging and to cause a failure so that semiconductor devices originally having a shorter life are eliminated.

[Embodiment 2]

An embodiment 2 relates to a semiconductor device that includes a mode switching circuit for performing a logical operation of a test signal and a signal fed from a control circuit for performing a power gating operation (limiting/cutting/isolation of power supply) and that turns a transistor for coupling/isolating an external power supply to/from an internal power supply of an internal circuit ON and OFF according to a signal fed from the mode switching circuit. The semiconductor device includes a mode decoder that generates a test signal according to combinations of logical values of signals input from the outside. Upon receiving a control signal and being switched into a test mode, the semiconductor device couples the internal circuit to the external power supply regardless of the logical value of the signal fed from the power-gating-performing control circuit and sets an accelerated test voltage to a predetermined value using the external power supply.

Figures 2A, 2B:
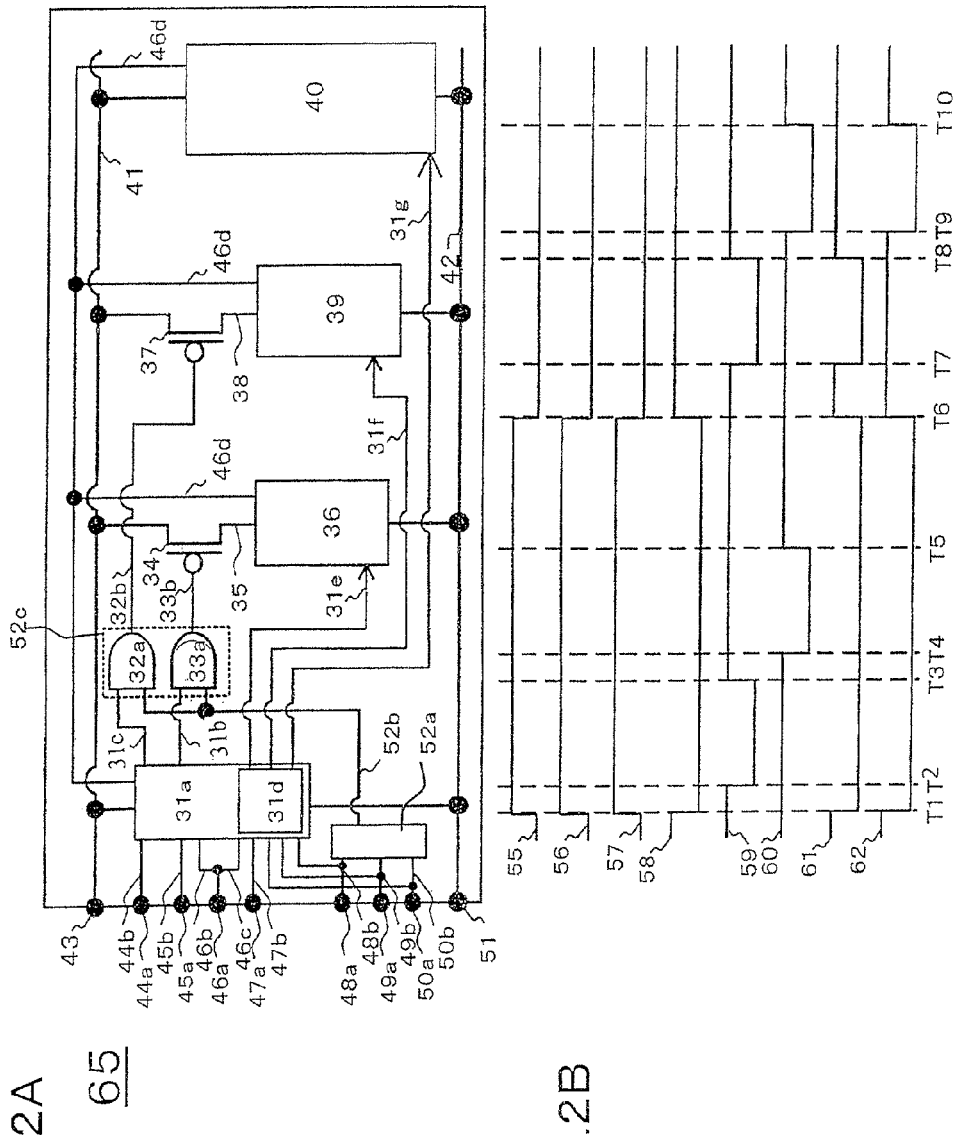

FIG. 2A is a circuit diagram of a semiconductor device 65 according to an embodiment 2, whereas FIG. 2B is a waveform chart of a mode switching circuit 52c and a mode decoder circuit 52a. Referring to FIG. 2A, the semiconductor device 65 includes a PMU 31a, the mode switching circuit 52c, the mode decoder circuit 52a, internal circuits 36, 39, and 40, transistors 34 and 37, and power lines 41 and 42.

The mode decoder circuit 52a receives control signals 48a, 49b, and 50b input from control signal terminals 48a, 49a, and 50a, respectively, and outputs a test signal 52b when a combination of logical values of these control signals is a predetermined value. As a result, the semiconductor device 65 is set into a test mode. The combinations that cause the mode decoder circuit 52a to output the test signal 52b will be described later with reference to FIG. 3.

According to a clock signal 44b input from a clock terminal 44a, a reset signal 45h input from a reset terminal 45a, an address signal 47b input from an address terminal 47a, and the control signals 48b, 49b, and 50b input from the control signal terminals 48a, 49a, and 50a, respectively, the PMU 31a receives input data 46b to be supplied to the internal circuits 36, 39, and 40 from a data terminal 46a and outputs output data 46c fed from the internal circuits 36, 39, and 40 to the data terminal 46a. Data is input and output between the PMU 31a and the internal circuits 36, 39, and 40 through an input/output data line 46d.

According to an operational state specified by the reset signal 45b, the address signal 47b, and the control signals 48b, 49b, and 50b, the PMU 31a also performs a power gating operation (coupling/isolation of the power supply) of the internal circuits 36, 39, and 40. Accordingly, to reduce the power consumption, the PMU 31a has a function of limiting (cutting) the power supply of the internal circuits 36 and 39 that do not have to operate.

To realize the power gating function (power supply limiting/cutting/isolating function), the PMU 31a outputs a control signal g1 (31b) and a control signal g2 (31c).

Additionally, the PMU 31a includes a clock generating circuit 31d. The clock generating circuit 31d amplifies the clock signal 44b or divides the frequency of the clock signal 44b, and distributes clock signals 31e, 31f, and 31g to the internal circuits 36, 39, and 40, respectively. When a combination of logical values of the control signals 48b, 49b, and 50b is a predetermined one, the semiconductor device 65 is set into a test mode. In the test mode, the clock generating circuit 31d outputs the clock signals 31e, 31f, and 31g having a predetermined clock frequency for an accelerated test using a frequency divider circuit for use in the accelerated test. In consideration of circuits of the internal circuits 36, 39, and 40 that operate during a logical "H" period of the clock signals 31e, 31f, and 31g, circuits that operate during the logical "L" period of the clock signals 31e, 31f, and 31g, and circuits that operate when the logical values of the clock signals 31e, 31f, and 31g are switched, the clock frequency for the accelerated test is decided so that the aging of the semiconductor device is efficiently accelerated.

The mode switching circuit 52c performs a logical operation of the control signal g1 (31b), the control signal g2 (31c), and the test signal 52b fed from the mode decoder circuit 52a and outputs an A1 signal 32b and an A2 signal 33b for controlling ON/OFF of the PMOS transistors 34 and 37. Details regarding functions and operations of the mode switching circuit 52c will be described with reference to FIG. 2B.

The mode switching circuit 52c includes an AND circuits 32a and 33a. The AND circuit 32a receives the test signal 52b with one input terminal and the control signal g1 (31b) with the other input terminal. The AND circuit 32a determines a logical multiplication (AND) and outputs the A1 signal 32b. The AND circuit 33a receives the test signal 52b with one input terminal and the control signal g2 (31c) with the other input terminal. The AND circuit 33a determines a logical multiplication (AND) and outputs the A2 signal 33b.

During an accelerated test of the semiconductor device 65, the mode decoder circuit 52a outputs the test signal 52b having a logical value "L". On the other hand, during a normal operation, the test signal 52b indicates a logical value "H".

A gate of the PMOS transistor 34 is supplied with the A2 signal 33b, while a source and a drain thereof are coupled to the power line 41 and an internal power line VDDM1 (35) of the internal circuit 36, respectively. According the logical value of the A2 signal 33b, the PMOS transistor 34 is turned ON and OFF, and serves as a switching circuit that couples/isolates the internal circuit 36 to/from the power line 41, respectively.

A gate of the PMOS transistor 37 is supplied with the A1 signal 32b, while a source and a drain thereof are coupled to the power line 41 and an internal power line VDDM2 (38) of the internal circuit 39, respectively. According to the logical value of the A1 signal 32b, the PMOS transistor 37 is turned ON and OFF, and serves as a switching circuit that couples/isolates the internal circuit 39 to/from the power line 41, respectively.

The internal circuit 40 is operated by the power supplied from the power lines 41 and 42. Since the internal circuit 40 is coupled to the power line 41 all the time, the internal circuit 40 operates all the time. In addition, the internal circuits 36 and 39 are coupled to the power line 42 and to the power line 41 according to the logical values of the A2 signal 33b and the A1 signal 32b, respectively. The internal circuits 36 and 39 operate when being coupled to the power line 41 through the PMOS transistors 34 and 37, respectively.

The power line 42 is coupled to an external terminal 51 and supplies a low-potential power (ground-level power). The power line 41 is coupled to an external terminal 43 and supplies a high-potential power.

Functions and operations of the mode switching circuit 52c will be described with reference to a waveform chart shown in FIG. 2B. As shown by waveforms 55, 56, and 57, the control signals 48b, 49b, and 50b indicate the logical value "H" during a period between a time T1 and a time T6, while the control signals indicate the logical value "L" during the rest of period. As shown by a waveform 58, the test signal 52b indicates the logical value "L" during the period between the time T1 and the time T6, i.e., during an accelerated test period of the semiconductor device 65.

As shown by a waveform 59, the control signal g1 (31b) having the logical value "H" is input to the mode switching circuit 52c during a period between the time T1 and a time T2 and a period between a time T3 and the time T6 of the period during which the test signal 52b having the logical value "L" is input to the mode switching circuit 52c. Similarly, as shown by a waveform 60, the control signal g2 (31c) having the logical value "H" is input to the mode switching circuit 52c during a period between the time T1 and a time T4 and a period between a time T5 and the time T6. However, as shown by waveforms 61 and 62, the logical values of the A1 signal 32b and the A2 signal 33b are fixed to "L" regardless of the logical values of the control signal g1 (31b) and the control signal g2 (31c). As a result, the PMOS transistors 34 and 37 are turned ON during the test period.

On the other hand, as shown by the waveform 58, the test signal 52a indicates the logical value "H" during a period between the time T6 and a time T10, i.e., during a normal operation period of the semiconductor device 65.

As shown by the waveforms 59, 60, 61, and 62, if the control signal g1 (31b) having the logical value "L" and the control signal g2 (31c) having the logical value "L" are input to the mode switching circuit 52c during a period between a time T7 and a time T8 and a period between a time T9 and the time T10 while the mode switching circuit 52c is supplied with the test signal 52b having the logical value "H", the A1 signal 32b and the A2 signal 33b having the logical value "L" are output, respectively, according to the logical values of the control signals.

Accordingly, during the normal operation period, the PMOS transistors 37 and 34 are turned ON during the logical "L" period of the A1 signal 32b and the A2 signal 33b, respectively.

FIG. 3 is a table showing combinations of logical values of the control signals 48b, 49b, and 50b and operations of the semiconductor device 65 for the respective combinations.

A column "A" shows a logical value of the control signal 48b. A column "B" shows a logical value of the control signal 49b. A column "C" shows a logical value of the control signal 50b. A column "STATE" shows an operational state of the semiconductor device 65. A column "PGT" shows a logical value of the test signal 52b.

According to the table shown in FIG. 3, when a combination (A, B, C) of the logical values of the control signals 48b, 49b, and 50b is equal to (0, 0, 0), the internal circuits 36, 39, and 40 are supplied with the power from the power line 41 and operate in accordance with the 400-MHz clock signals 31e, 31f, and 31g, respectively.

When the combination (A, B, C) of the logical values of the control signals 48b, 49b, and 50b is equal to (0, 0, 1), the internal circuits 36, 39, and 40 are supplied with the power from the power line 41 and operate in accordance with the 200-MHz clock signals 31e, 31f, and 31g, respectively.

When the combination (A, B, C) of the logical values of the control signals 48b, 49b, and 50b is equal to (0, 1, 0), the internal circuits 36, 39, and 40 are supplied with the power from the power line 41 and operate in accordance with the 100-MHz clock signals 31e, 31f, and 31g, respectively.

When the combination (A, B, C) of the logical values of the control signals 48b, 49b, and 50b is equal to (0, 1, 1), the internal circuits 36, 39, and 40 are supplied with the power from the power line 41 and operate in accordance with an external clock signal input from the clock terminal 44a.

When the combination (A, B, C) of the logical values of the control signals 48b, 49b, and 50b is equal to (1, 0, 0), the internal circuits 36 and 39 are supplied with the power from the power line 41 and operate in accordance with the 400-MHz clock signals 31e and 31f, respectively. Additionally, the internal circuit 40 is supplied with the power from the power line 41 and operates in accordance with the 100-MHz clock signal 31g.

The combination (A, B, C) of the logical values of the control signals 48b, 49b, and 50b equal to (1, 0, 1) and (1, 1, 0) indicates that the internal circuits 36, 39, and 40 are in a reserved state. The reserved state corresponds to a state where operational states corresponding to (1, 0, 1) and (1, 1, 0) have not been set yet but are set newly. When the combination (A, B, C) of the logical values of the control signals 48b, 49b, and 50b is equal to (0, 0, 0) to (1, 1, 0), the test signal 52b indicates the logical value "H".

When the combination (A, B, C) of the logical values of the control signals 48b, 49b, and 50b is equal to (1, 1, 1), the internal circuits 36, 39, and 40 are supplied with the power from the power line 41 regardless of the logical values of the control signal g1 (31b) and the control signal g2 (31c) and the test signal 52b indicates the logical value "L". In addition, the internal circuit 36, 39, and 40 operate in accordance with the clock signals 31e, 31f, and 31g having the clock frequency for the accelerated test.

As described above, since the PMOS transistors 34 and 37 are turned ON regardless of the logical values of the control signal g1 (31b) and the control signal g2 (31c) fed from the PMU 31a during the test period, the internal circuits 36 and 39 are coupled to the high-potential power supply through the power line 41 and the external terminal 43. By setting the voltage level of the high-potential power fed to the external terminal 43 higher than that fed during the normal operation period in this manner, the accelerated test is performed on the semiconductor device 65. In addition, the clock frequencies of the clock signals 31e, 31f, and 31g fed to the internal circuits 36, 39, and 40, respectively, is set to clock frequencies that permit an efficient accelerated test.

In addition, in the semiconductor device 65, an entry to a test mode is controlled by the control signals 48b, 49b, and 50b. Accordingly, the semiconductor device 65 does not require a test terminal, which thus decreases the number of external terminals.

[Embodiment 3]

An embodiment 3 relates to a semiconductor device that includes a mode switching circuit for performing a logical operation of a test signal and a signal fed from a control circuit for performing a power gating operation and that turns a transistor for coupling/isolating an external power supply to/from an internal power supply of an internal circuit ON and OFF according to a signal fed from the mode switching circuit. The semiconductor device includes a mode decoder that generates a test signal according to combinations of logical values of signals input from the outside. Furthermore, the semiconductor device includes a clock generating circuit for generating clock signals having different clock frequencies according to a clock selection signal fed from the mode decoder. Upon receiving a control signal and being switched into a test mode, the semiconductor device couples the internal circuit to the external power supply and sets an accelerated test voltage level to a predetermined value using the external power supply.

FIG. 4A is a circuit diagram of a semiconductor device 105 according to an embodiment 3, whereas FIG. 4B is a waveform chart of a mode switching circuit 92c and a mode decoder circuit 92a. Referring to FIG. 4A, the semiconductor device 105 includes a PMU 71a, the mode switching circuit 92c, the mode decoder circuit 92a, a clock generating circuit 84c, internal circuits 76, 79, and 80, PMOS transistors 74 and 77, and power lines 81 and 82.

The mode decoder circuit 92a receives control signals 88a, 89b, and 90b input from control signal terminals 88a, 89a, and 90a, respectively, and outputs a test signal 92b and a clock frequency selection signal 92d when a combination of logical values of these signals is equal to a predetermined value. The combinations that cause the mode decoder circuit 92a to output the test signal 92b will be described later with reference to FIG. 5. The clock frequency selection signal 92d is constituted by a plurality of signals and forms a code through logical values of the plurality of signals.

According to a clock signal 84b input from a clock terminal 84a, a reset signal 85b input from a reset terminal 85a, an address signal 87b input from an address terminal 87a, and the control signals 88b, 89b, and 90b input from control signal terminals 88a, 89a, and 90a, respectively, the PMU 71a receives input data 86b to be supplied to the internal circuits 76, 79, and 80 from a data terminal 86a and outputs output data 86c fed from the internal circuits 76, 79, and 80 to the data terminal 86a. Data is input and output between the PMU 71a and the internal circuits 76, 79, and 80 through an input/output data line 86d.

According to an operational state specified by the reset signal 85b, the address signal 87b, and the control signals 88b, 89b, and 90b, the PMU 71a also performs a power gating operation of the internal circuits 76 and 79. Accordingly, to reduce the power consumption, the PMU 71a has a function of limiting (cutting) the power supply of the internal circuits 76 and 79 that do not have to operate.

To realize the power gating function (power supply limiting/cutting/isolating function), the PMU 71a outputs a control signal g1 (71b) and a control signal g2 (71c).

Additionally, the clock generating circuit 84c amplifies the clock signal 84b or divides the frequency of the clock signal 84b, and distributes clock signals 84d, 84e, and 84f to the internal circuits 76, 79, and 80, respectively. The clock frequencies of the clock signals 84d, 84e, and 84f are selected in accordance with the code represented by the logical value of the clock frequency selection signal 92d fed from the mode decoder circuit 92a. The detail of the clock generating circuit 84c will be described with reference to FIG. 6.

The mode switching circuit 92c performs a logical operation of the control signal g1 (71b), the control signal g2 (71c), and the test signal 92b fed from the mode decoder circuit 92a and outputs an A1 signal 72b and an A2 signal 73b for controlling ON/OFF of PMOS transistors 77 and 74, respectively. Details regarding functions and operations of the mode switching circuit 92c will be described with reference to FIG. 4B.

The mode switching circuit 92c includes AND circuits 72a and 73a The AND circuit 72a receives the test signal 92b with one input terminal and the control signal g1 (71b) with the other input terminal. The AND circuit 72a determines a logical multiplication (AND) and outputs the A1 signal 72b. The AND circuit 73a receives the test signal 92b with one input terminal and the control signal g2 (71c) with the other input terminal. The AND circuit 73a determines a local multiplication (AND) and outputs the A2 signal 73b.

During a test of the semiconductor device 105, the mode decoder circuit 92a outputs the test signal 92b having the logical value "L". On the other hand, during a normal operation, the test signal 92b indicates the logical value "Hu".

A gate of the PMOS transistor 74 is supplied with the A2 signal 73b, while a source and a drain thereof are coupled to the power line 81 and an internal power line VDDM1 (75) of the internal circuit 76, respectively. According the logical value of the A2 signal 73b, the PMOS transistor 74 is turned ON and OFF, and serves as a switching circuit that couples/isolates the internal circuit 76 to/from the power line 81, respectively.

A gate of the PMOS transistor 77 is supplied with the A1 signal 72b, while a source and a drain thereof are coupled to the power line 81 and an internal power line VDDM2 (78) of the internal circuit 79, respectively. According to the logical level of the A1 signal 72b, the PMOS transistor 77 is turned ON and OFF, and serves as a switching circuit that couples/isolates the internal circuit 79 to/from the power line 81, respectively.

The internal circuit 80 is operated by the power supplied from the power lines 81 and 82. Since the internal circuit 80 is coupled to the power line 81 all the time, the internal circuit 80 operates all the time. In addition, the internal circuits 76 and 79 are coupled to the power line 82 and to the power line 81 according to the logical values of the A2 signal 73b and the A1 signal 72b, respectively. The internal circuits 76 and 79 operate when being coupled to the power line 81 through the PMOS transistors 74 and 77, respectively.

The power line 82 is coupled to an external terminal 91 and supplies a low-potential power (ground-level power). The power line 81 is coupled to an external terminal 83 and supplies a high-potential power.

Functions and operations of the mode switching circuit 92c will be described with reference to a waveform chart shown in FIG. 4B. As shown by waveforms 95, 96, and 97, the control signals 88b, 89b, and 90b indicate a logical value "H" during a period between a time T1 and a time T6, while the control signals indicate the logical value "L" during the rest of period. As shown by a waveform 98, the test signal 92b indicates the logical value "L" during the period between the time T1 and the time T6, i.e., during an accelerated test period of the semiconductor device 105.

As shown by a waveforms 99, the control signal g1 (71b) having the logical value "H" is supplied to the mode switching circuit 92c during a period between the time T1 and a time T2 and a period between a time T3 and the time T6 of the period during which the test signal 92b having the logical value "L" is supplied to the mode switching circuit 92c. Similarly, as shown by a waveform 100, the control signal g2 (71c) having the logical value "H" is input to the mode switching circuit 92c during a period between the time T1 and a time T4 and a period between a time T5 and the time T6. However, as shown by waveforms 101 and 102, logical values of the A1 signal 72b and the A2 signal 73b are fixed to "L" regardless of the logical values of the control signal g1 (71b) and the control signal g2 (71c). As a result, the PMOS transistors 74 and 77 are turned ON during the test period.

On the other hand, as shown by the waveform 98, the test signal 92a indicates the logical value "H" during a period between the time T6 and a time T10, i.e., during a normal operation period of the semiconductor device 105.

As shown by the waveforms 99, 100, 101, and 102, if the control signal g1 (71b) and the control signal g2 (71c) having the logical value "L" are input during a period between a time T7 and a time T8 and a period between a time T9 and the time T10 while the mode switching circuit 92c is supplied with the test signal 92b having the logical value "H", the A1 signal 72b and the A2 signal 73b having the logical value "L" are output according to the logical value of the control signals, respectively.

Accordingly, during the normal operation period, the PMOS transistors 77 and 74 are turned ON during the logical "L" period of the A1 signal 72b and the A2 signal 73b, respectively.

FIG. 5 is a table showing combinations of logical values of the control signals 88b, 89b, and 90b and operations of the semiconductor device 105 for the respective combinations.

A column "A" shows a logical value of the control signal 88b. A column "B" shows a logical value of the control signal 89b. A column "C" shows a logical value of the control signal 90b. A column "STATE" shows an operational state of the semiconductor device 105. A column "PGT" shows a logical value of the test signal 92b.

According to the table shown in FIG. 5, when a combination (A, B, C) of the logical values of the control signals 88b, 89b, and 90b is equal to (0, 0, 0), the internal circuits 76, 79, and 80 are supplied with the power from the power line 81 and receive the 400-MHz clock signals 84d, 84e, and 84f, respectively.

When the combination (A, B, C) of the logical values of the control signals 88b, 89b, and 90b is equal to (0, 0, 1), the internal circuits 76, 79, and 80 are supplied with the power from the power line 81 and receive the 200-MHz clock signals 84d, 84e, and 84f, respectively.

When the combination (A, B, C) of the logical values of the control signals 88b, 89b, and 90b is equal to (0, 1, 0), the internal circuits 76, 79, and 80 are supplied with the power from the power line 81 and receive the 100-MHz clock signals 84d, 84e, and 84f, respectively.

When the combination (A, B, C) of the logical values of the control signals 88b, 89b, and 90b is equal to (0, 1, 1), the internal circuits 76, 79, and 80 are supplied with the power from the power line 81 and receive a clock input from the clock terminal 84a as the clock signals 84d, 84e, and 84f, respectively.

When the combination (A, B, C) of the logical values of the control signals 88b, 89b, and 90b is equal to (1, 0, 0), the internal circuits 76 and 79 are supplied with the power from the power line 81 and operate in accordance with the 400-MHz clock signals 84d and 84e, respectively. Additionally, the internal circuit 80 is supplied with the power from the power line 81 and operates in accordance with the 100-MHz clock signal 84f.

The combination (A, B, C) of the logical values of the control signals 88b, 89b, and 90b equal to (1, 0, 1) and (1, 1, 0) indicates that the internal circuits 76, 79, and 80 are in a reserved state. The reserved state corresponds to a state where operational states corresponding to (1, 0, 1) and (1, 1, 0) have not been set yet but are newly set. When the combination (A, B, C) of the logical values of the control signals 88b, 89b, and 90b is equal to (0, 0, 0) to (1, 1, 0), the test signal 92b indicates the logical value "H".

When the combination (A, B, C) of the logical values of the control signals 88b, 89b, and 90b is equal to (1, 1, 1), the internal circuits 76, 79, and 80 are supplied with the power from the power line 81 and the test signal 92b indicates the logical value "L". In addition, the internal circuit 76, 79, and 80 operate in accordance with the clock signals 84d, 84e, and 84f having the clock frequencies for the accelerated test, respectively. In the semiconductor device 105, the clock signal 84b received by the clock terminal 84a according to the clock frequency selection signal 92d may be directly used as the clock signals 84d, 84e, and 84f.

Figure 6:
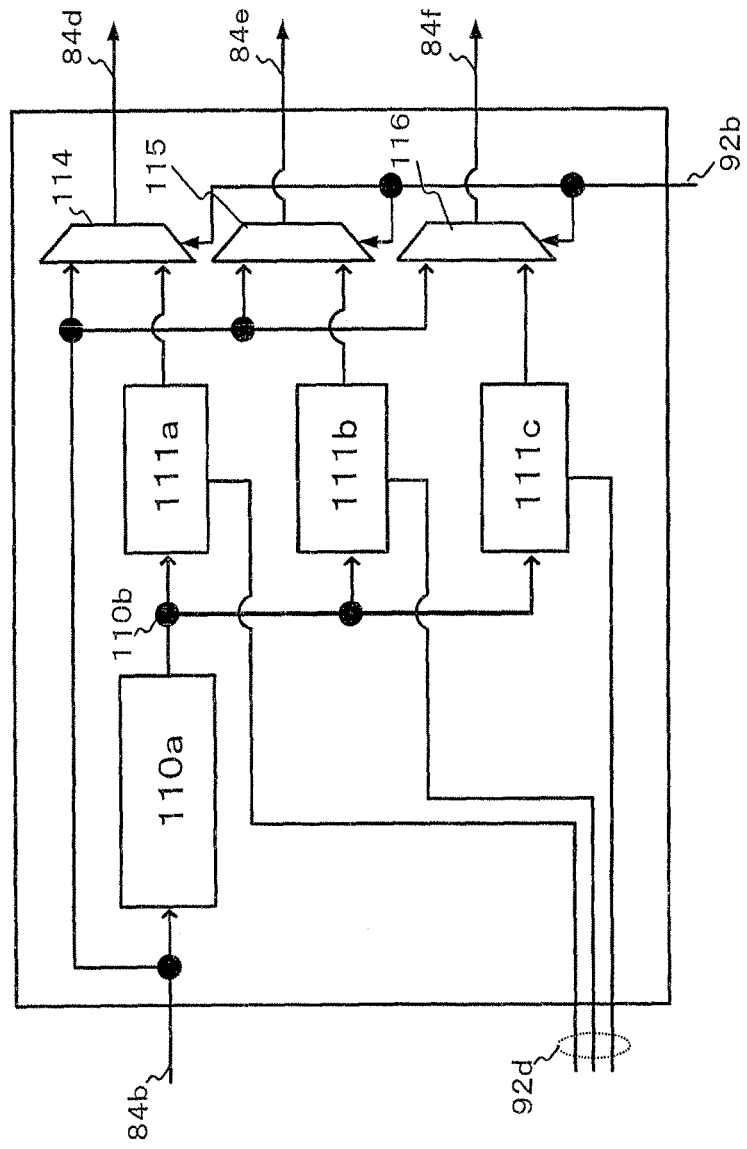
FIG. 6 is a circuit diagram of a clock generating circuit 84c.

FIG. 6 is a circuit diagram of the clock generating circuit 84c. The clock generating circuit 84c includes an oscillator 110a, frequency dividers 111a, 112a, and 113a, and switches 114, 115, and 116.

The oscillator 110a receives the clock signal 84b and outputs a clock signal 110b having a predetermined frequency to the frequency dividers 111a, 112a, and 113a. The frequency divider 111a divides the frequency of the clock signal 110b. More specifically, the frequency divider 111a changes a frequency dividing rate according to the code represented by the clock frequency selection signal 92d and outputs a clock signal 111b having a frequency of 400 MHz, 200 MHz, or 100 MHz to the switch 114. The frequency divider 112a has a function similar to that of the frequency divider 111a and outputs a clock signal 112b to the switch 115. The frequency divider 113a also has a function similar to that of the frequency divider 111a and outputs a clock signal 113b to the switch 116.

The switch 114 receives the clock signal 111b fed from the frequency divider 111a with one terminal and the clock signal 84b with other terminal. According to the logical value of the test signal 92b, the switch 114 outputs either the clock signal 111b or 84b as the clock signal 84d.

The switch 115 receives the clock signal 112b fed from the frequency divider 112a with one terminal and the clock signal 84b with the other terminal. According to the logical value of the test signal 92b, the switch 115 outputs either the clock signal 112b or 84b as the clock signal 84e.

The switch 116 receives the clock signal 113b fed from the frequency divider 113a with one terminal and the clock signal 84b with the other terminal. According to the logical value of the test signal 92b, the switch 116 outputs either the clock signal 113b or 84b as the clock signal 84f.

As described above, since the PMOS transistors 74 and 77 are turned ON during the test period, the internal circuits 76 and 79 are coupled to the high-potential power supply through the power line 81 and the external terminal 83 regardless of the logical levels of the control signal g1 (71b) and the control signal g2 (71c). By setting the voltage level of the high-potential power fed to the external terminal 83 higher than that fed during the normal operation period in this manner, the accelerated test is performed on the semiconductor device 105.

In addition, in the semiconductor device 105, an entry to a test mode is controlled by the control signals 88b, 89b, and 90b. Accordingly, the semiconductor device 105 does not require a test terminal, which thus decreases the number of external terminals.

Additionally, since an external clock received from the clock terminal 84a may be directly used as the clock signals 84d, 84e, and 84f, the accelerated test is performed using an external clock having a clock frequency optimum for the accelerated test.

[Embodiment 4]

An embodiment 4 relates to a semiconductor device that includes a mode switching circuit for performing a logical operation of a test signal and a signal fed from a control circuit for performing a power gating operation and that turns a transistor for coupling/isolating an external power supply to/from an internal power supply of an internal circuit ON and OFF according to a signal fed from the mode switching circuit. The semiconductor device includes a test control circuit for generating a test signal for use in control of the internal circuit in accordance with a test signal input from the outside. Upon receiving the external test signal and being switched into a test mode, the semiconductor device couples the internal circuit to an external power supply to guarantee an operation of a scan test circuit included in the internal circuit.

Figure 7A:
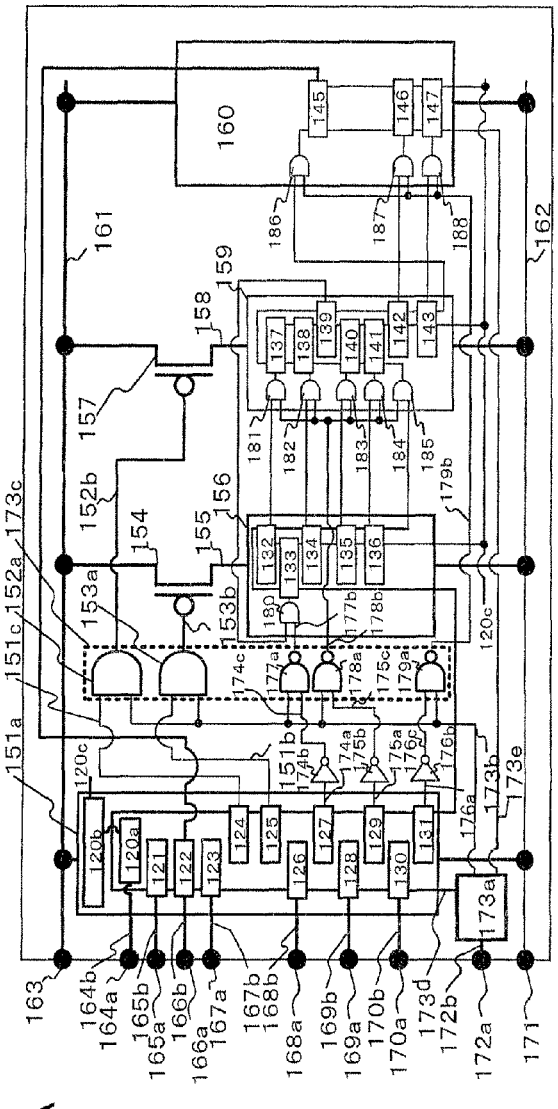
Figure 7B:
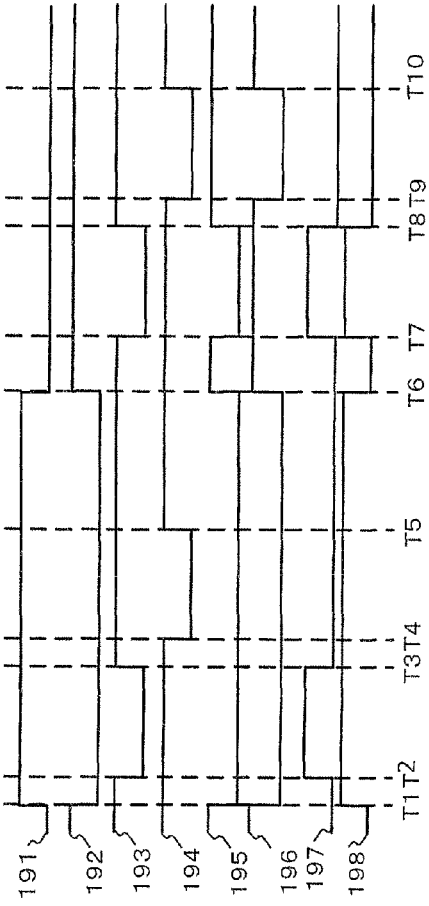

FIG. 7A is a circuit diagram of a semiconductor device 190 according to the embodiment 4, whereas FIG. 7B is a waveform chart of a mode switching circuit 173c and a test control circuit 173a.

Referring to FIG. 7A, the semiconductor device 190 includes a PMU 151a, the mode switching circuit 173c, the test control circuit 173a, internal circuits 156, 159, and 160, PMOS transistors 154 and 157, and power lines 161 and 162.

According to a clock signal 164b input from a clock terminal 164a, a reset signal 165b input from a reset terminal 165a, an address signal 167b input from an address terminal 167a, and control signals 168b, 169b, and 170b input from control signal terminals 168a, 169a, and 170a, respectively, the PMU 151a receives data 166b to be supplied to the internal circuits 156, 159, and 160 from a data terminal 166a and outputs the data 166b fed from the internal circuits 156, 159, and 160 to the data terminal 166a. Data is input and output between the PMU 151a and the internal circuits 156, 159, and 160 through latch circuits 122 and 145.

The clock signal 164b is received by an input circuit 120a. The reset signal 165b is received by a latch circuit 121. The data 166b is received by the latch circuit 122. The address signal 167b is constituted by a plurality of signals and is received by a plurality of latch circuits 123. The control signals 168b, 169b, and 170b are received by latch circuits 126, 128, and 130, respectively. During a scan test, the latch circuits 121, 122, 123, 124, 125, 126, 127, 128, 129, 130, and 131 latch data output from the neighboring latch circuits of a scan latch chain on the basis of the clock signal 120c. On the other hand, during a normal operation, the latch circuits latch normal input/output signals on the basis of the clock signal 120c.

Meanwhile, the latch circuits 121 to 143 and the latch circuits 145, 146, and 147 included in the PMU 151a and input/output circuits arranged in the internal circuits 156, 159, and 160 are coupled in series like a ring starting from the test control circuit 173a. The scan latch chain refers to a state where latch circuits are coupled in series like a ring as described above. The scan test is a test in which the test control circuit 173a sends data generated by the test control circuit 173a to a first stage of the latch circuit array and determines whether the input/output latch circuits are working correctly or not on the basis of data fed from the final stage. Meanwhile, the test control circuit 173a can generate a plurality of data patterns.

The PMU 151a has a clock generating circuit 120b. The clock generating circuit 120b amplifies the clock signal 164b received by the input circuit 120a or divides the frequency of the clock signal 164b and outputs the clock signal 120c to the internal circuits 156, 159, and 160.

According to an operational state specified by the reset signal 165b, the address signal 167b, and the control signals 168b, 169b, and 170b, the PMU 151a performs a power gating operation of the internal circuits 156, 159, and 160. Accordingly, to reduce the power consumption, the PMU 151a has a function of limiting (cutting) the power supply of the internal circuits 156 and 159 that do not have to operate.

To realize the power gating function (power supply limiting/cutting/isolating function), the PMU 151a outputs a control signal g1 (151b) and a control signal g2 (151c).

The PMU 151a outputs isolation signals 174a, 175a, and 176a. The isolation signal 174a blocks an input signal from entering the signal-receiving latch circuit 133 of the internal circuit 156. The isolation signal 175a blocks an input signal from entering the signal-receiving latch circuits 137, 138, 140, and 141 of the internal circuit 159. The isolation signal 176a blocks an input signal from entering the signal-receiving latch circuits 146 and 147 of the internal circuit 160.

The mode switching circuit 173c performs a logical operation of the control signal g1 (151b), the control signal g2 (151c), and a test signal 173b fed from the test control circuit 173a and outputs an A1 signal 152b and an A2 signal 153b for controlling ON/OFF of the PMOS transistors 154 and 157. Details regarding functions and operations of the mode switching circuit 173c will be described with reference to FIG. 7B.

The mode switching circuit 173c includes AND circuits 152a and 153a and NAND circuits 177a, 178a, and 179a. The AND circuit 152a receives the test signal 173b with one input terminal and the control signal g1 (151b) with the other input terminal. The AND circuit 152a determines a logical multiplication (AND) and outputs the A1 signal 152b. The AND circuit 153a receives the test signal 173b with one input terminal and the control signal g2 (151c) with the other input terminal. The AND circuit 153a determines a logical multiplication (AND) and outputs the A2 signal 153b.

The NAND circuit 177a receives the test signal 173b with one input terminal and an output signal 174c fed from an inverter 174b having received the isolation signal 174a with the other input terminal. The NAND circuit 117a determines a NAND and outputs a signal 177b. The signal 177b is input to one terminal of an AND circuit 180. An input signal supplied to the other terminal of the AND circuit 180 from the latch circuit 139 is blocked by the AND circuit 180.

The NAND circuit 178a receives the test signal 173b with one input terminal and an output signal 175c fed from an inverter 175b having received the isolation signal 175a with the other input terminal. The NAND circuit 178a determines a NAND and outputs a signal 178b. The signal 178b is supplied to one terminal of AND circuits 181, 182, 183, 184, and 185. Input signals supplied to the other terminal of the AND circuits 181, 182, 183, 184, and 185 from the latch circuits 132, 134, 135, and 136 are blocked by the AND circuits 181, 182, 183, 184, and 185, respectively.

The NAND circuit 179a receives the test signal 173b with one input terminal and an output signal 176c fed from an inverter 176b having received the isolation signal 176a with the other input terminal. The NAND circuit 179a determines a NAND and outputs a signal 179b. The signal 179b is input to one input terminal of AND circuits 186, 187, and 188. Input signals input to the other terminal of the AND circuits 186, 187, and 188 from the latch circuits 142 and 143 are blocked by the AND circuits 186, 187, and 188, respectively.

Upon receiving an external test signal 172b from a test signal terminal 172a, the test control circuit 173a outputs the test signal 173b. During a scan test of the semiconductor device 190, the test control circuit 173a outputs the test signal 173b having a logical value "L". On the other hand, during a normal operation, the logical value of the test signal 173b is set to "H". Meanwhile, the external test signal 172b is constituted by a plurality of signals and carries a code signal through combinations of the logical values. Accordingly, at the time of the test of the semiconductor device 190, the test control circuit 173a generates a plurality of data patterns according to the code of the external test signal 172b to perform a so-called scan test.

The latch circuits 121 to 147 included in the PMU 151a and input/output circuits arranged in the internal circuits 156, 159, and 160 are coupled in series like a ring starting from the test control circuit 173a.

The test control circuit 173a is coupled to the latch circuit 130 through a scan path signal 173d. The test control circuit 173a is also coupled to the latch circuit 147 through a scan path signal 173e. A path of the signal lines that couples the latch circuit chain constituted during the scan test is called a scan chain path. The scan path signals 173d and 173e propagate through the scan chain path.

A gate of the PMOS transistor 154 is supplied with the A2 signal 153b, while a source and a drain thereof are coupled to the power line 161 and an internal power line VDDM1 (155) of the internal circuit 156, respectively. According the logical value of the A2 signal 153b, the PMOS transistor 154 is turned ON and OFF, and serves as a switching circuit that couples/isolates the internal circuit 156 to/from the power line 161, respectively.

A gate of the PMOS transistor 157 is supplied with the A1 signal 152b, while a source and a drain thereof are coupled to the power line 161 and an internal power line VDDM2 (158) of the internal circuit 159, respectively. According to the logical value of the A1 signal 152b, the PMOS transistor 157 is turned ON and OFF, and serves as a switching circuit that couples/isolates the internal circuit 159 to/from the power line 161, respectively.

The internal circuit 160 is operated by the power supplied from the power lines 161 and 162. Since the internal circuit 160 is coupled to the power line 161 all the time, the internal circuit 160 operates all the time. In addition, the internal circuits 156 and 159 are coupled to the power line 162 and to the power line 161 according to the logical values of the A2 signal 153b and the A1 signal 152b, respectively, as described above. The internal circuits 156 and 159 operate when being coupled to the power line 161 through the PMOS transistors 154 and 157, respectively.

The power line 162 is coupled to an external terminal 171 and supplies a low-potential power (ground-level power). The power line 161 is coupled to an external terminal 163 and supplies a high-potential power.

Functions and operations of the mode switching circuit 173c will be described with reference to a waveform chart shown in FIG. 7B. As shown by a waveform 191, the external test signal 172b indicates a logical value "H" during a period between a time T1 and a time T6, while the external test signal indicates a logical value "L" during the rest of period. As shown by a waveform 192, the test signal 173b indicates the logical value "L" during the period between the time T1 and the time T6, i.e., during a test period of the semiconductor device 190.

As shown by a waveform 193, the control signal g1 (151b) having the logical value "H" is input to the mode switching circuit 173c during a period between the time T1 and a time T2 and a period between a time T3 and the time T6 of the period during which the test signal 173b having the logical value "L" is supplied to the mode switching circuit 173c. Similarly, as shown by a waveform 194, the control signal g2 (151c) having the logical value "H" is input to the mode switching circuit 173c during a period between the time T1 and a time T4 and a period between a time T5 and the time T6. However, as shown by waveforms 195 and 196, logical values of the A1 signal 152b and the A2 signal 153b are fixed to "L" regardless of the logical values of the control signal g1 (151b) and the control signal g2 (151c). As a result, the PMOS transistors 154 and 157 are turned ON during the test period.

As shown by waveforms 197 and 198, even if the isolation signal 174a having the logical value "H" is input during a period between the time T2 and the time T3 to enable the input to the internal circuit 156 in response to the control signal g1 (151b) having the logical value "L", the logical value of the output of the NAND circuit 177a is fixed to "H". This allows the input signal to the latch circuit 133 to pass therethrough.

On the other hand, as shown by the waveform 192, the test signal 173b indicates the logical value "H" during a period between the time T6 and a time T10, i.e., during a normal operation period of the semiconductor device 190.

As shown by the waveforms 191, 192, 193, 194, 195, and 196, if the control signal g1 (151b) having the logical value "L" and the control signal g2 (151c) having the logical value "L" are input to the mode switching circuit 173c during a period between a time T7 and a time T8 and a period between a time T9 and the time T10 while the mode switching circuit 173c is supplied with the test signal 173b having the logical value "H", the A1 signal 152b and the A2 signal 153b having the logical value "L" are output according to the logical values of the control signals, respectively.

Accordingly, during the normal operation period, the PMOS transistors 157 and 154 are turned ON while the logical values of the A1 signal 152b and the A2 signal 153b are set to "L", respectively.

As shown by the waveforms 197 and 198, when the PMU 151a outputs the isolation signal 174a having the logical value "H" during the period between the time T7 and the time T8 to enable the input to the internal circuit 156 in response to the control signal g1 (151b) having the logical value "L", the logical value of the signal 177b output from the NAND circuit 177a changes depending on the logical value and the input signal is transferred to the latch circuit 133.

Similarly, when the PMU 151a outputs the isolation signal 175a having the logical value "H" during the period between the time T9 and the time T10 to enable the input to the internal circuit 159 in response to the control signal g2 (151c) having the logical value "L", the logical value of the signal 178b output from the NAND circuit 178a changes depending on the logical value and the input signal is transferred to the latch circuits 137, 138, 140, and 141.

Even if the PMU 151a outputs the isolation signal 176a having the logical value "L" during the period between the time T1 and the time T6 to disable the input to the internal circuit 160, the input to the internal circuit 160 is always enabled by the NAND circuit 179a of the mode switching circuit 173c since the logical value of the test signal 173b is set to "L". On the other hand, when the isolation signal 176a having the logical value "L" is output from the PMU 151a during the period between the time T6 and the time T10, the input to the internal circuit 160 is disabled by the NAND circuit 179a of the mode switching circuit 173c since the logical value of the test signal 173b is set to "H".

As described above, since the PMOS transistors 154 and 157 are compulsorily turned ON by the mode switching circuit 173c during the test period regardless of the logical values of the control signal g1 (151b) and the control signal g2 (151c), the internal circuits 156 and 159 are coupled to the high-potential power supply through the power line 161 and the external terminal 163. Since this allows the high-potential power to be supplied to the internal circuits 156 and 159 during the scan test and the scan latch chain is maintained, the scan test is performed.

In addition, in the semiconductor device 190, the function of the test control circuit 173a allows the test control circuit 173a to generate a plurality of data patterns according to a code signal fed from the test signal terminal 172a during the scan test. Accordingly, whether the input/output latch circuits are working correctly or not is accurately determined in the scan test.

[Embodiment 5]

An embodiment 5 relates to a semiconductor device that includes a mode switching circuit for performing a logical operation of a test signal and a signal fed from a control circuit for performing a power gating operation and that turns a transistor for coupling/isolating an external power supply to/from an internal power supply of an internal circuit ON and OFF according to a signal fed from the mode switching circuit. The semiconductor device includes a terminal for receiving a mode switching signal, a terminal for receiving an external test signal, and a test control circuit for generating a test signal according to the external test signal. Upon receiving the mode switching signal and being switched into a test mode, the semiconductor device couples the internal circuit to an external power supply to guarantee an operation of a scan test circuit included in the internal circuit.

Figure 8A:
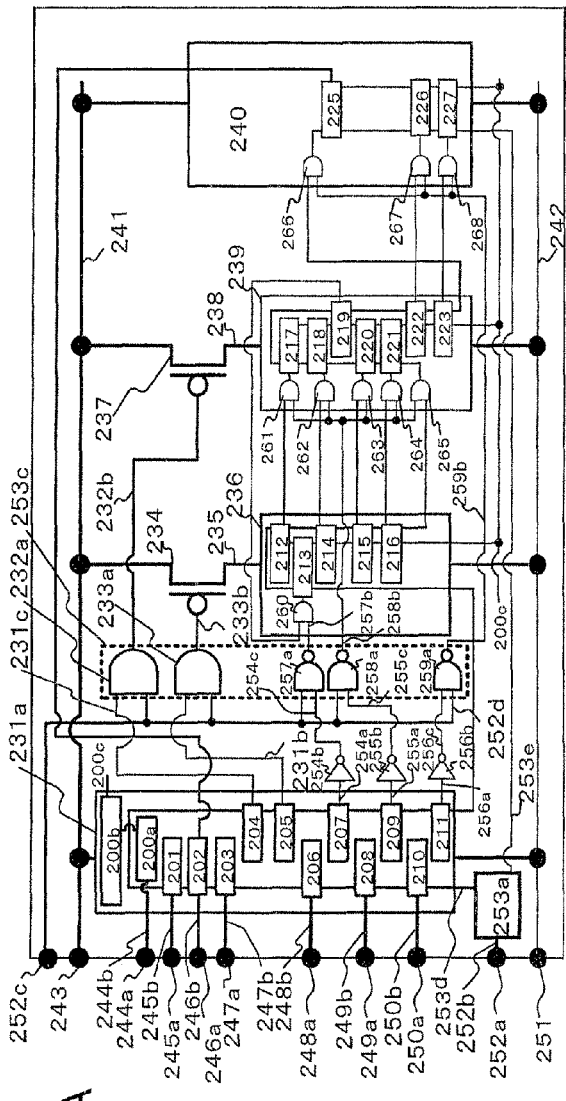
Figure 8B:
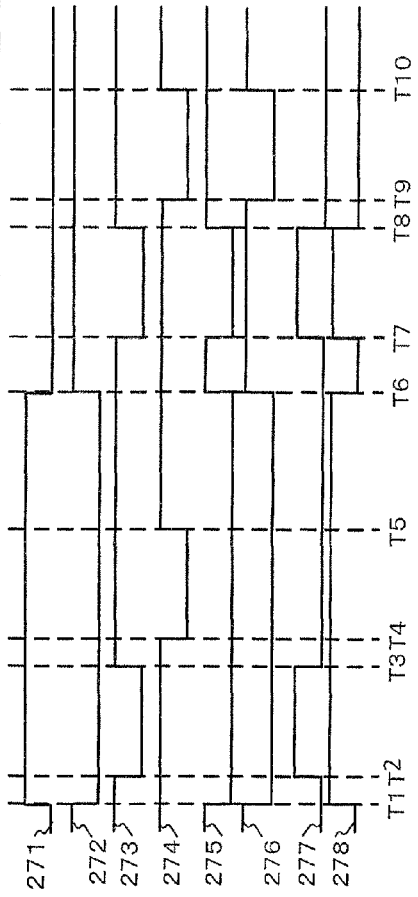

FIG. 8A is a circuit diagram of a semiconductor device 270 according to the embodiment 5, whereas FIG. 8B is a waveform chart of a mode switching circuit 253c and a test control circuit 253a.

Referring to FIG. 8A, the semiconductor device 270 includes a PMU 231a, the mode switching circuit 253c, the test control circuit 253a, internal circuits 236, 239, and 240, PMOS transistors 234 and 237, and power lines 241 and 242.

According to a clock signal 244b input from a clock terminal 244a, a reset signal 245b input from a reset terminal 245a, an address signal 247b input from an address terminal 247a, and control signals 248b, 249b, and 250b input from control signal terminals 248a, 249a, and 250a, respectively, the PMU 231a receives data 246b to be supplied to the internal circuits 236, 239, and 240 from a data terminal 246a and outputs the data 246b fed from the internal circuits 236, 239, and 240 to the data terminal 246a. Data is input and output between the PMU 231a and the internal circuits 236, 239, and 240 through latch circuits 202 and 225.

The clock signal 244b is received by an input circuit 200a. The reset signal 245b is received by a latch circuit 201. The data 246b is received by the latch circuit 202. The address signal 247b is constituted by a plurality of signals and is received by a plurality of latch circuits 203. The control signals 248b, 249b, and 250b are received by latch circuits 206, 208, and 210, respectively. During a scan test, the latch circuits 201, 202, 203, 204, 205, 206, 207, 208, 209, 210, and 211 latch the data output from the neighboring latch circuits of a scan latch chain on the basis of a clock signal 200c. On the other hand, during a normal operation, those latch circuits latch normal input/output signals on the basis of to the clock signal 200c.

According to an operational state specified by the reset signal 245b, the address signal 247b, and the control signals 248b, 249b, and 250b, the PMU 231a performs a power gating operation of the internal circuits 236, 239, and 240. Accordingly, to reduce the power consumption, the PMU 231a has a function of limiting (cutting) the power supply of the internal circuits 236 and 239 that do not have to operate.

To realize the power gating function (power supply limiting/cutting/isolating function), the PMU 231a outputs a control signal g1 (231b) and a control signal g2 (231c).

The PMU 231a outputs isolation signals 254a, 255a, and 256a. The isolation signal 254a blocks an input signal from entering to a signal-receiving latch circuit 213 of the internal circuit 236. The isolation signal 255a blocks an input signal from entering signal-receiving latch circuits 217, 218, 220, and 221 of the internal circuit 239. The isolation signal 256a blocks an input signal from entering signal-receiving latch circuits 226 and 227 of the internal circuit 240.

The PMU 231a has a clock generating circuit 200b. The clock generating circuit 200b amplifies a clock signal 244b received by the input circuit 200a or divides the frequency of the clock signal 244b, and outputs the clock signal 200c to the internal circuits 236, 239, and 240.

The mode switching circuit 253c performs a logical operation of the control signal g1 (231b), the control signal g2 (231c), and a mode switching signal 252d fed from a mode switching signal terminal 252c and outputs an A1 signal 232b and an A2 signal 233b for controlling ON/OFF the PMOS transistors 237 and 234, respectively. Details regarding functions and operations of the mode switching circuit 253c will be described later with reference to FIG. 8B.

The mode switching circuit 253c includes AND circuits 232a and 233a and NAND circuits 257a, 258a, and 259a. The AND circuit 232a receives the mode switching signal 252d with one input terminal and the control signal g1 (231b) with the other input terminal. The AND circuit 232a determines a logical multiplication (AND) and outputs the A1 signal 232b. The AND circuit 233a receives the mode switching signal 252d with one input terminal and the control signal g2 (231c) with the other input terminal. The AND circuit 233a determines a local multiplication (AND) and outputs the A2 signal 233b.

The NAND circuit 257a receives the mode switching signal 252d with one input terminal and an output signal 254c fed from an inverter 254b having received the isolation signal 254a with the other input terminal. The NAND circuit 257a determines a NAND and outputs a signal 257b. The signal 257b is supplied to one terminal of an AND circuit 260. An input signal input to the other terminal of the AND circuit 260 from a latch circuit 219 is blocked by the AND circuit 260.

The NAND circuit 258a receives the mode switching signal 252d with one input terminal and an output signal 255c fed from an inverter 255b having received the isolation signal 255a with the other input terminal. The NAND circuit 258a determines a NAND and outputs a signal 258b. The signal 258b is supplied to one terminal of AND circuits 261, 262, 263, 264, and 265. Input signals supplied to the other terminal of the AND circuits 261, 262, 263, 264, and 265 from latch circuits 212, 214, 215, and 216 are blocked by the AND circuits 261, 262, 263, 264, and 265, respectively.

The NAND circuit 259a receives the mode switching signal 252d with one input terminal and an output signal 256c fed from an inverter 256b having received the isolation signal 256a with the other input terminal. The NAND circuit 259a determines a NAND and outputs a signal 259b. The signal 259b is supplied to one terminal of AND circuits 266, 267, and 268. Input signals supplied to the other terminal of the AND circuits 266, 267, and 268 from latch circuits 222 and 223 are blocked by the AND circuits 266, 267, and 268, respectively.

The test control circuit 253a performs a so-called scan test on the semiconductor device 270 according to the code of an external test signal 252b fed from a test signal terminal 252a.

The external test signal 252b is constituted by a plurality of signals and carries a code signal through the combinations of logical values thereof.

The latch circuits 201 to 227 included in the PMU 231a and input/output circuits arranged in the internal circuits 236, 239, and 240 are coupled in series like a ring starting from the test control circuit 253a.

The test control circuit 253a is coupled to the latch circuit 210 through a scan path signal 253d. The test control circuit 253a is also coupled to the latch circuit 227 through a scan path signal 253e. A path of the signal lines that couples the latch circuit chain constituted during the scan test is called a scan chain path. The scan path signals 253d and 253e propagate through the scan chain path.

In addition, a scan test is a test in which the test control circuit 253a sends data generated by the test control circuit 253a to a first stage of the latch circuit array and determines whether the input/output latch circuits are working correctly or not on the basis of the data fed from the final stage.

A gate of the PMOS transistor 234 is supplied with the A2 signal 233b, while a source and a drain thereof are coupled to the power line 241 and an internal power line VDDM1 (235) of the internal circuit 236, respectively. According the logical value of the A2 signal 233b, the PMOS transistor 234 is turned ON and OFF, and serves as a switching circuit that couples/isolates the internal circuit 236 to/from the power line 241, respectively.

A gate of the PMOS transistor 237 is supplied with the A1 signal 232b, while a source and a drain thereof are coupled to the power line 241 and an internal power line VDDM2 (238) of the internal circuit 239, respectively. According to the logical value of the A1 signal 232b, the PMOS transistor 237 is turned ON and OFF, and serves as a switching circuit that couples/isolates the internal circuit 239 to/from the power line 241.

The internal circuit 240 is operated by the power supplied from the power lines 241 and 242. Since the internal circuit 240 is coupled to the power line 241 all the time, the internal circuit 240 operates all the time. In addition, the internal circuits 236 and 239 are coupled to the power line 242 and to the power line 241 according to the logical values of the A2 signal 233b and the A1 signal 232b, respectively, as described above. The internal circuits 236 and 239 operate when being coupled to the power line 241 through the PMOS transistors 234 and 237, respectively.

The power line 242 is coupled to an external terminal 251 and supplies a low-potential power (ground-level power). The power line 241 is coupled to an external terminal 243 and supplies a high-potential power.

Functions and operations of the mode switching circuit 253c will be described with reference to a waveform chart shown in FIG. 8B. As shown by a waveform 271, the external test signal 252b indicates the logical value "H" during a period between a time T1 and a time T6, while the external test signal indicates the logical value "L" during the rest of period. As shown by a waveform 272, the mode switching signal 252d indicates the logical value "L" during the period between the time T1 and the time T6, i.e., during a test period of the semiconductor device 270.

As shown by waveforms 273, 274, 275, and 276, even if the control signal g1 (231b) having the logical value "L" and the control signal g2 (231c) having the logical value "L" are input during a period between a time T2 and a time T3 and a period between a time T4 and a time T5 while the mode switching signal 252d having the logical value "L" is supplied to the mode switching circuit 253c, the logical values of the A1 signal 232b and the A2 signal 233b are fixed to "L" regardless of the logical values of the control signal g1 (231b) and the control signal g2 (231c), respectively. As a result, the PMOS transistors 234 and 237 are turned ON during the test period.

More specifically, as shown by the waveforms 273, the control signal g1 (231b) having the logical value "H" is supplied to the mode switching circuit 253c during a period between the time T1 and a time T2 and a period between a time T3 and the time T6 of the period during which the mode switching circuit 235c is supplied with the mode switching signal 252d having the logical value "L". Similarly, as shown by the waveform 274, the control signal g2 (231c) having the logical value "H" is supplied to the mode switching circuit 253c during a period between the time T1 and a time T4 and a period between a time T5 and the time T6. However, as shown by the waveforms 275 and 276, the logical values of the A1 signal 232b and the A2 signal 233b are fixed to "L" regardless of the logical values of the control signal g1 (231b) and the control signal g2 (231c). As a result, the PMOS transistors 234 and 237 are turned ON during the test period.

As shown by waveforms 277 and 278, even if the isolation signal 254a having the logical value "H" is input during a period between the time T1 and the time T6 to disable the input signal to the internal circuit 236 in response to the control signal g1 (231b) having the logical value "H", the logical value of a signal output from the NAND circuit 257a is fixed to "H" regardless of the logical value of the isolation signal 254a, due to which the input signal to the latch circuit 213 is compulsorily passed.

On the other hand, as shown by the waveform 272, the mode switching signal 252d indicates the logical value "H" during a period between the time T6 and a time T10, i.e., during a normal operation period of the semiconductor device 270.

As shown by the waveforms 271, 272, 273, 274, 275, and 276, if the control signal g1 (231b) and the control signal g2 (231c) having the logical value "L" are supplied to the mode switching circuit 253c during a period between a time T7 and a time T8 and a period between a time T9 and the time T10 while the mode switching circuit 253c is supplied with the mode switching signal 252da having the logical value "H", the A1 signal 232b and the A2 signal 233b having the logical value "L" are output according to the logical values of the control signals, respectively.

Accordingly, during the normal operation period, the PMOS transistors 234 and 237 are turned ON while the logical values of the A2 signal 233b and the A1 signal 232b are set to "L", respectively.

As shown by the waveforms 277 and 278, when the isolation signal 254a having the logical value "H" is input to enable the input to the internal circuit 236 in response to the control signal g1 (231b) having the logical value "L" during the period between the time T7 and the time T8, the logical value of the signal output from the NAND circuit 257a changes depending on the logical value of the isolation signal and the input signal is transferred to the latch circuit 213.

Similarly, when the PMU 231a outputs the isolation signal 255a having the logical value "H" during the period between the time T9 and the time T10 to enable the input to the internal circuit 239 in response to the control signal g2 (231b) having the logical value "L", the logical value of the signal 258b output from the NAND circuit 258a changes depending on the logical value of the isolation signal and the input signal is transferred to the latch circuits 217, 218, 220, and 221.

Even if the PMU 231a outputs the isolation signal 256a having the logical value "L" during the period between the time T1 and the time T6 to disable the input to the internal circuit 240, the input to the internal circuit 240 is always enabled by the NAND circuit 259a of the mode switching circuit 253c since the logical value of the mode switching signal 252d is set to "L". On the other hand, when the isolation signal 256a having the logical value "L" is output from the PMU 231a during the period between the time T6 and the time T10, the input to the internal circuit 240 is disabled by the NAND circuit 259a of the mode switching circuit 253c since the logical value of the mode switching signal 252d is set to "H".

As described above, since the PMOS transistors 234 and 237 are compulsorily turned ON by the mode switching circuit 253c during the test period regardless of the logical values of the control signal g1 (231b) and the control signal g2 (231c), the internal circuits 236 and 239 are coupled to the high-potential power supply through the power line 241 and the external terminal 243. Since this allows the high-potential power to be supplied to the internal circuits 236 and 239 during the scan test and the scan latch chain is maintained, the scan test is performed.

In addition, in the semiconductor device 270, an entry to the test mode may be controlled by the mode switching signal 252d supplied from the mode switching signal terminal 252c. Thus, the number of circuits constituting the test control circuit 253a are reduced.

[Embodiment 6]

An embodiment 6 relates to a semiconductor device that includes a mode switching circuit for performing a logical operation of a test signal and a signal supplied from a control circuit for performing a power gating operation and that turns a transistor for coupling/isolating an external power supply to/from an internal power supply of an internal circuit ON and OFF according to a signal fed from the mode switching circuit. The semiconductor device includes a terminal for receiving an external test signal and a test control circuit for generating a test signal according to the external test signal. Upon being switched into a test mode, the semiconductor device couples the internal circuit to an external power supply regardless of a logical value of the signal fed from the power-gating-performing control circuit to guarantee an operation of a scan test circuit included in the internal circuit. In addition, the semiconductor device has a circuit that operates for the scan test during the scan test.

FIGS. 9A and 9B are circuit diagrams of a semiconductor device 450 according to the embodiment 6.

Referring to FIG. 9A, the semiconductor device 450 includes a PMU 391a, a mode switching circuit 413c, a test control circuit 413a, an internal circuit 414a including internal circuits 396 and 399, an internal circuit 400, PMOS transistors 394 and 397, and power lines 401 and 402.

According to a clock signal 404b input from a clock terminal 404a, a reset signal 405b input from a reset terminal 405a, an address signal 407b input from an address terminal 407a, and control signals 408b, 409b, and 410b input from control signal terminals 408a, 409a, and 410a, respectively, the PMU 391a receives data 406b to be supplied to the internal circuits 396, 399, and 400 from a data terminal 406a and outputs the data 406b fed from the internal circuits 396, 399, and 400 to the data terminal 406a. Data is input and output between the PMU 391a and the internal circuits 316, 319, and 320 through latch circuits 362 and 384. In addition, the clock signal 404b is received by an input circuit 360a. The reset signal 405b is received by a latch circuit 361. The data 406b is received by the latch circuit 362. The address signal 407b is constituted by a plurality of signals and is received by a plurality of latch circuits 363. The control signals 408b, 4Q9b, and 410b are received by latch circuits 367, 369, and 371, respectively. During a scan test, the latch circuits 361, 362, 363, 364, 365, 366a, 367, 368a, 369, 370a, 371, and 372a latch the data output from the neighboring latch circuits of a scan latch chain on the basis of a clock signal 360c. On the other hand, during a normal operation, those latch circuits latch normal input/output signals on the basis of the clock signal 360c.

According to an operational state specified by the reset signal 405b, the address signal 407b, and the control signals 408b, 409b, and 410b, the PMU 391a performs a power gating operation of the internal circuit 414a including the internal circuits 369 and 399.

Accordingly, to reduce the power consumption, the PMU 391a has a function of limiting (cutting) the power supply of the internal circuits 396 and 399 that do not have to operate.

To realize the power gating function (power supply limiting/cutting/isolating function), the PMU 391a outputs a control signal g1 (391b) and a control signal g2 (391c).

The PMU 391a has a clock generating circuit 360b. The clock generating circuit 360b amplifies the clock signal 404b received by the input circuit 360a or divides the frequency of the clock signal 404b, and outputs the clock signal 360c to the internal circuits 414a and 400.

The PMU 391a outputs a scan selection signal 366b, a data signal 368b, a scan path signal 372b directed to the internal circuit 414a, a mask signal 370c, and a signal fed from the latch circuit 372a through an inverter 372c as a mask signal 372d.

The scan selection signal 366b disables the signals fed from user logic circuits 419, 420, 421, 434, 435, and 336 and selects a scan chain path.

The data signal 368b is input data directed to the internal circuit 396 from the PMU 391a.

The scan path signal 372b is an output signal fed from the latch circuit 372b of the PMU 391a included in the latch circuit chain. The scan path signal 372b propagates through the scan chain path.

The mask signal 370c masks a signal traveling between the internal circuits 396 and 399. Masking of the signal traveling between the internal circuits 396 and 399 with the mask signal 370c allows latch circuits 441a, 442a, and 443a to latch the data fed from the user logic circuits 434, 435, and 436 used in the scan test, respectively. The mask signal 370c is output from the latch circuit 370a of the PMU 391a.

The mask signal 372d masks a signal traveling between the internal circuits 414a (the internal circuits 396 and 399) and 400. The mask signal 372d blocks a signal from entering latch circuits 386 and 387 from the internal circuit 414a during the scan test. The mask signal 372d is output from the latch circuit 372a of the PMU 391a.

The mode switching circuit 413c performs a logical operation of the control signal g1 (391b), the control signal g2 (391c), and a test signal 413b fed from the test control circuit 413a and outputs an A1 signal 392b and an A2 signal 393b for controlling ON/OFF of the PMOS transistors 394 and 397. Functions and operations of the mode switching circuit 413c are similar to those of the mode switching circuit 333c having been described with reference to FIG. 9B with regard to the A1 signal 392b and the A2 signal 393b being output according to the logical value of the test signal 413b.

The mode switching circuit 413c includes AND circuits 392a and 393a. The AND circuit 392a receives the test signal 413b with one input terminal and the control signal g1 (391b) with the other input terminal. The AND circuit 392a determines a logical multiplication (AND) and outputs the A1 signal 392b. The AND circuit 393a receives the test signal 413b with one input terminal and the control signal g2 (391c) with the other input terminal. The AND circuit 393a determines a local multiplication (AND) and outputs the A2 signal 393b.

The test control circuit 413a performs a so-called scan test on the semiconductor device 450 according to the code of an external test signal 412b fed from an external test signal terminal 412a.

The external test signal 412b is constituted by a plurality of signals and carries a code signal through the combinations of logical values thereof.

The test control circuit 413a is coupled to the latch circuit 371 through a scan path signal 413d and to the latch circuit 387 through a scan path signal 413e.

The latch circuits 361 to 387 included in the PMU 391a and input/output circuits arranged in the internal circuits 396, 399, and 400 are coupled in series like a ring starting from the test control circuit 413a. The scan test is a test in which the test control circuit 413a sends data generated by the test control circuit 413a to a first stage latch circuit 371 of the latch circuit array and determines whether the input/output latch circuits are working correctly or not on the basis of the data fed from the final stage latch circuit 387.

A gate of the PMOS transistor 394 is supplied with the A2 signal 393b, while a source and a drain thereof are coupled to the power line 401 and an internal power line VDDM1 (395) of the internal circuit 396, respectively. According the logical value of the A2 signal 393b, the PMOS transistor 394 is turned ON and OFF, and serves as a switching circuit that couples/isolates the internal circuit 396 to/from the power line 401, respectively.

A gate of the PMOS transistor 397 is supplied with the A1 signal 392b, while a source and a drain thereof are coupled to the power line 401 and an internal power line VDDM2 (398) of the internal circuit 399, respectively. According to the logical value of the A1 signal 392b, the PMOS transistor 397 is turned ON and OFF, and serves as a switching circuit that couples/isolates the internal circuit 399 to/from the power line 401, respectively.

The internal circuit 400 has the latch circuits 384, 386, and 387, AND circuits 385b, 385c, and 385d, and an OR circuit 385a.

The OR circuit 385a receives a scan path signal 414b output from the internal circuit 414a and the test signal 413b with its input terminals. The OR circuit 385a allows the scan path signal 414b to pass through the latch circuit 384 if the logical value of the test signal 413b is "L". The OR circuit 385a, on the other hand, blocks the scan path signal 414b if the logical value of the test signal 413b is "H". The AND circuits 385b, 385c, and 385d receive data signals 414c, 414d, and 414e with one input terminal thereof, respectively, and the mask signal 372d with the other input terminal. The AND circuits 385b, 385c, and 385d allow the data signals 414c, 414d, and 414d to pass through the latch circuits 384, 386, and 387, respectively, if the logical value of the mask signal 372d is "H". On the other hand, the AND circuits 385b, 385c, and 385d block the data signals 414c, 414d, and 414e, respectively, if the logical value of the mask signal 372c is "L". During the scan test, the latch circuits 384, 386, 387 receive the clock signal 360c and latch data fed from the neighboring latch circuits. On the other hand, during the normal operation period, the latch circuits 384, 386, and 387 latch signals fed from the AND circuits 385b, 385c, and 385d, respectively.

The internal circuit 400 is operated by the power supplied from the power lines 401 and 402. Since the internal circuit 400 is coupled to the power line 401 all the time, the internal circuit 400 operates all the time.

In addition, the internal circuits 396 and 399 are coupled to the power line 402 and to the power line 401 according to the logical values of the A2 signal 393b and the A1 signal 392b, respectively, as described above. The internal circuits 396 and 399 operate when being coupled to the power line 401 through the PMOS transistors 394 and 397, respectively.

The power line 402 is coupled to an external terminal 411 and supplies a low-potential power (ground-level power). The power line 401 is coupled to an external terminal 403 and supplies a high-potential power.

A latch circuit chain included in the internal circuit 414a will be described with reference to FIG. 9B.

The latch circuit chain includes latch circuits 415a, 416a, 418a, 425a, 426a, 427a, 441a, 442a, and 443a, switching circuits 417, 422, 423, 424, 438, 439, and 440, user logic circuits 419, 420, 421, 434, 435, and 436, AND circuits 428, 429, 430, and 437, a NAND circuit 433, an inverter 432, and an OR circuit 431. A path of signal lines coupling a latch circuit chain formed during the scan test is called a scan chain path.

The latch circuit 418a receives the clock signal 360c and latches the scan path signal 372b fed from the latch circuit 372a.

The latch circuit 416a receives the clock signal 360c and latches a signal fed from the switching circuit 417. The switching circuit 417 receives a data signal 368b fed from the latch circuit 368a with one input terminal and a data signal 418b fed from the latch circuit 418a with the other input terminal. The switching circuit 417 outputs one of the signals received with the input terminal selected by the scan selection signal 366b.

The latch circuit 415a receives the clock signal 360c and latches an output signal fed from the latch circuit 416a.

The latch circuit 425a receives the clock signal 360c and latches an output signal fed from the switching circuit 422. The switching circuit 422 receives an output signal fed from the user logic circuit 419 with one input terminal and an output signal fed from the latch circuit 415a with the other input terminal. The switching circuit 422 outputs one of the signals received with the input terminal selected by the scan selection signal 366b.

The user logic circuit 419 receives an output signal fed from the latch circuit 415a, performs a predetermined logical transform operation on the logical value of the output signal, and outputs the logically transformed signal.

The latch circuit 426a receives the clock signal 360c and latches an output signal fed from the switching circuit 423. The switching circuit 423 receives an output signal fed from the user logic circuit 420 with one input terminal and an output signal fed from the latch circuit 425a with the other input terminal. The switching circuit 423 outputs one of the signals received with the input terminal selected by the scan selection signal 366b. The user logic circuit 420 is similar to the user logic circuit 419. The user logic circuit 420 receives an output signal fed from the latch circuit 416a, performs a predetermined logical transform operation on the logical value of the output signal, and outputs the logically transformed signal.

The latch circuit 427a receives the clock signal 360c and latches an output signal fed from the switching circuit 424. The switching circuit 424 receives an output signal fed from the user logic circuit 421 with one input terminal and an output signal fed from the latch circuit 426a with the other input terminal. The switching circuit 424 outputs one of the signals received with the input terminal selected by the scan selection signal 366b. The user logic circuit 421 is similar to the user logic circuit 419. The user logic circuit 421 receives an output signal fed from the latch circuit 418a, performs a predetermined logical transform operation on the logical value of the output signal, and outputs the logically transformed signal.

The latch circuit 443a receives the clock signal 437b output from the AND circuit 437 and latches an output signal fed from the switching circuit 440. The latch circuit 443a also outputs a data signal 441e to the AND circuit 385d of the internal circuit 400. The switching circuit 440 receives an output signal of the OR circuit 431 with one input terminal and an output signal fed from the user logic circuit 436 with the other input terminal. The switching circuit 440 outputs one of the signals received with the input terminal selected by the scan selection signal 366b. The user logic circuit 436 is similar to the user logic circuit 419. The user logic circuit 436 receives an output signal fed from the AND circuit 430, performs a predetermined logical transform operation on the logical value of the output signal, and outputs the logically transformed signal.

The OR circuit 431 receives an output signal of the latch circuit 427a with one input terminal and the test signal 413b with the other input terminal. The OR circuit 431 determines an OR of the logical values of the input signals and outputs the result as the output signal.

The AND circuit 430 receives the output signal of the latch circuit 427a with one input terminal and the mask signal 370c with the other input terminal. The AND circuit 430 determines an AND of the logical values of the input signals and outputs the result as an output signal.

The latch circuit 442a receives the clock signal 437b output from the AND circuit 437 and latches the output signal fed from the switching circuit 439. The latch circuit 442a also outputs the data signal 414d to the AND circuit 385c of the internal circuit 400. The switching circuit 439 receives an output signal fed from the latch circuit 443a with one input terminal and an output signal fed from the user logic circuit 435 with the other input terminal. The switching circuit 439 outputs one of the signals received with the input terminal selected by the scan selection signal 366b.

The user logic circuit 435 is similar to the user logic circuit 419. The user logic circuit 435 performs a predetermined logical transform operation on the logical value of an output signal fed from the AND circuit 429, and outputs the logically transformed signal. The AND circuit 429 receives the output signal fed from the latch circuit 426a with one input terminal and the mask signal 370c with the other input terminal. The AND circuit 429 determines an AND of the logical values of the input signals and outputs the result as the output signal.

The latch circuit 441a receives the clock signal 437b output from the AND circuit 437 and latches the output signal fed from the switching circuit 438. The latch circuit 441a also outputs the data signal 414c to the AND circuit 385b of the internal circuit 400 and the scan path signal 414b to the OR circuit 385a. The switching circuit 438 receives the output signal fed from the latch circuit 442a with one input terminal and the output signal fed from the user logic circuit 434 with the other input terminal. The switching circuit 438 outputs one of the signals received with the input terminal selected by the scan selection signal 366b.

The user logic circuit 434 is similar to the user logic circuit 419. The user logic circuit 434 performs a predetermined logical transform operation on the logical value of an output signal fed from the AND circuit 428 and outputs the logically transformed signal. The AND circuit 428 receives the output signal fed from the latch circuit 425a with one input terminal and the mask signal 370c with the other input terminal. The AND circuit 428 determines an AND of the logical values of the input signals and outputs the result as the output signal.

The AND circuit 437 receives the clock signal 360c with one input terminal and an output signal fed from the NAND circuit 433 with the other input terminal. The AND circuit 437 determines an AND of the clock signal 360c and the output signal fed from the NAND circuit 433 and outputs the result as an output signal. More specifically, when the logical value of the test signal 413b becomes "L", the OR circuit 431 forms the scan chain path. When the logical value of the test signal 413b becomes "L", the clock signal 360c also passes through the AND circuit 437. When the logical value of the mask signal 370c becomes "H", the signals fed from the latch circuits 425a, 426a, and 427a pass through the AND circuits 428, 429, and 430, respectively, and the clock signal 360c also passes through the AND circuit 437.

FIG. 10A shows waveforms of the mode switching circuit 413c, whereas FIG. 10B shows waveforms of the output signal fed from the AND circuit 437, the test signal 413b, the scan selection signal 366b, the mask signal 370c, and the mask signal 372d.

Referring to the waveform chart shown in FIG. 10A, functions and operations of the mode switching circuit 413c will be described. As shown by a waveform 451, the external test signal 412b indicates the logical value "H" during a period between a time T1 and a time T6, while the external test signal indicates the logical value "L" during the rest of period. As shown by a waveform 452, the test signal 413b indicates the logical value "L." during the period between the time T1 and the time T6, i.e., during a test period of the semiconductor device 450.

As shown by waveforms 453, 454, 455, and 456, even if the control signal g1 (391b) and the control signal g2 (391c) having the logical value "L" are input to the mode switching circuit 413c during a period between the time T1 and the time T2 and a period between the time T3 and the time T6 and during a period between the time T1 and the time T4 and a period between the time T5 and the T6 while the mode switching signal 413b having the logical value "L" is supplied to the mode switching circuit 413c, the logical values of the A1 signal 392b and the A2 signal 393b are fixed to "L" regardless of the logical values of the control signal g1 (391b) or the control signal g2 (391c). As a result, the PMOS transistors 394 and 397 are turned ON during the test period.

On the other hand, as shown by the waveform 452, the test signal 413b indicates the logical value "H" during a period between the time T6 and a time T10, i.e., a normal operation period of the semiconductor device 450.

As shown by the waveforms 451, 452, 453, 454, 455, and 456, if the control signal g1 (391b) and the control signal g2 (391c) having the logical value "H" are input to the mode switching circuit 413c during a period between a time T7 and a time T8 and a period between a time T9 and a time T10 while the test signal 413b having the logical value "H" is supplied to the mode switching circuit 413c, the A1 signal 392b and the A2 signal 393b having the logical value "L" are output according to the logical values of the control signals, respectively.

Accordingly, during the normal operation period, the PMOS transistors 394 and 397 are turned ON while the logical values of the A1 signal 392b and the A2 signal 393b are set to "L".

FIG. 10B is a diagram showing waveforms of the output signal fed from the AND circuit 437, the test signal 413b, the scan selection signal 366b, the mask signal 370c, and the mask signal 372d. As shown by a waveform 457, the logical values of the mask signals 370a and 372d are controlled to be "H" or "L" as usual.

As shown by a waveform 458, during the scan test, i.e., during a period between T1 and T14, the logical value of the test signal 413b is set to "L". During the normal operation period, the logical value of the test signal 413b is set to "H".

AS shown by a waveform 459, while the logical value of the test signal 413b is set to "L", the output signal fed from the AND circuit 437 serves as a clock signal that alternately repeats the logical values "H" and "L" at predetermined cycles. During the rest of period, the output signal fed from the AND circuit 437 indicates the logical value "H".

As described above, although the logical values of the test signal 413b and the scan selection signal 366b are set to "L" and "H", respectively, during the scan test, the test signal 413b and the scan selection signal 366b have pulses of the logical value "L" at predetermined cycles. This allows the clock signal 360c to pass through the AND circuit 437 during the scan test.

As shown by a waveform 460, the logical level of the scan selection signal 366b is set to "H" during the scan test. The scan selection signal 366b also has pulses of the logical value "L" during a period between T3 and T4, a period between T5 and T6, a period between T7 and T8, a period between T9 and T10, and a period between T11 and T12, i.e., at predetermined cycles. On the other hand, during the normal operation period, the logical value of the scan selection signal 366b is set to "L". As a result, the logical values of the mask signals 370c and 372d are not fixed during the scan test. More specifically, the logical values of the mask signals 370c and 372d are controlled to be "H" or "L" by the PMU 391a.

On the other hand, the switching circuits 438, 439, and 440 allow the output signals fed from the user logic circuits 434, 435, and 436 to pass therethrough, respectively. In this manner, the latch circuits 441a, 442a, and 443a latch data fed from the user logic circuits 434, 435, and 436 during the scan test, respectively. More specifically, during the scan test, data fed from the user logic circuits 434, 435, and 436 is written in the latch circuits instead of the data fed from the test control circuit and the result is examined by the test control circuit. Since the data is written in the latch circuits according to the logical values of the mask signals 370c and 372d, for example, it is possible to determine whether the control operation of the logical values of the mask signals 370c and 372d is correctly performed or not.

When the logical value of the scan selection signal 366b is set to "L" during the scan test, the switching circuits 422, 423, 424, 438, 439, and 440 allow signals fed from the user logic circuits 419, 420, 421, 434, 435, and 436 to pass therethrough, respectively. On the other hand, when the logical value of the scan selection signal 366b is set to "H", the switching circuits 422, 423, 424, 438, 439, and 440 allow a signal fed from the scan chain path to pass therethrough.

Accordingly, when the logical value of the scan selection signal 366b is set to "L", the latch circuits 425a, 426a, 427a, 441a, 442a, and 443a latch data fed from the user logic circuits 419, 420, 421, 434, 435, and 436, respectively. On the other hand, when the logical value of the scan selection signal 366b is set to "H", the data is read out from or written in the latch circuits 425a, 426a, 427a, 441a, 442a, and 443a constituting the scan chain using the scan chain path.

As described above, since the PMOS transistors 394 and 397 are compulsorily turned ON by the mode switching circuit 413c during the test period regardless of the logical values of the control signal g1 (391b) and the control signal g2 (391c), the internal circuits 396 and 399 are coupled to the high-potential power supply through the power line 401 and the external terminal 403. Since this allows the high-potential power to be supplied to the internal circuits 396 and 399 during the scan test and the scan latch chain is maintained, the scan test is performed.

In addition, in the semiconductor device 450, the function of the test control circuit 413a allows the test control circuit 413a to generate a plurality of data patterns according to the code signal fed from the test signal terminal 412a during the scan test. Thus, whether the input/output latch circuits are working correctly or not is accurately determined during the scan test.

During the scan test, for example, it is possible to write data fed from the user logic circuits 434, 435, and 436 in the latch circuits instead of the data fed from the test control circuit and to examine the result by the test control circuit. In this manner, whether the mask function of the AND circuits 428, 429, and 430 is working correctly or not is examined.

Numbers applying embodiments (embodiment 1, embodiment 2 or embodiment 3 etc.) do not show priorities of the embodiments. Many variations and modifications will be apparent to those skilled in the art.

What is claimed is:

1. A semiconductor device comprising:
a first power line;
a second power line;
a switch for selecting coupling of the first power line to the second power line or isolation of the first power line from the second power line based on driving state of the semiconductor device;
a switching circuit for switching the driving state of the semiconductor device from one of a test state and a normal operation state to another of the test state and the normal operation state;
a first control circuit for outputting a signal to the switching circuit, wherein the switching circuit couples the first power line to the second power line or isolates the first power line from the second power line according to a logical value of the signal when test signal is set to a first logical value, whereas the switching circuit couples the first power line to the second power line when test signal is set to a second logical value;
a second control circuit, wherein an operational state of the semiconductor device is switched between the test state and the normal operational state according to the test signal, a code based on a plurality of signals are input to the second control circuit, and the second control circuit outputs a signal having the second logical value as the test signal when the code indicates the test state, whereas the second control circuit outputs a signal having the first logical value as the test signal when the code indicates the normal operational state;
an internal circuit block to be coupled to the second power line;
a latch circuit chain including a latch circuit included in the internal circuit block; and
a signal blocking circuit for feeding a logical value of a data signal through so as to be supplied to the latch circuit chain when the test signal is set to the second logical value.

* * * * *